US011705322B2

(12) United States Patent
Jiang et al.

(10) Patent No.: US 11,705,322 B2
(45) Date of Patent: Jul. 18, 2023

(54) GROUP III NITRIDE SUBSTRATE, METHOD OF MAKING, AND METHOD OF USE

(71) Applicant: SLT Technologies, Inc, Los Angeles, CA (US)

(72) Inventors: Wenkan Jiang, Walnut, CA (US); Mark P. D'Evelyn, Vancouver, WA (US); Derrick S. Kamber, Camas, WA (US); Dirk Ehrentraut, Camas, WA (US); Jonathan D. Cook, Santa Barbara, CA (US); James Wenger, Vancouver, WA (US)

(73) Assignee: SLT TECHNOLOGIES, INC., Los Angeles, CA (US)

( * ) Notice: Subject to any disclaimer, the term of this patent is extended or adjusted under 35 U.S.C. 154(b) by 261 days.

(21) Appl. No.: 16/882,219

(22) Filed: May 22, 2020

(65) Prior Publication Data

US 2021/0249252 A1 Aug. 12, 2021

Related U.S. Application Data

(60) Provisional application No. 62/975,078, filed on Feb. 11, 2020.

(51) Int. Cl.
*C30B 7/10* (2006.01)
*C30B 7/00* (2006.01)
(Continued)

(52) U.S. Cl.
CPC ........ *H01L 21/02005* (2013.01); *C30B 7/005* (2013.01); *C30B 7/105* (2013.01);
(Continued)

(58) Field of Classification Search
CPC ..... C30B 29/406; C30B 29/403; C30B 29/40; C30B 7/005; H01L 21/0254;
(Continued)

(56) References Cited

U.S. PATENT DOCUMENTS 3,303,053 A 2/1967 Strong et al.
4,030,966 A 6/1977 Hornig et al.
(Continued)

FOREIGN PATENT DOCUMENTS

CN 101061570 A 10/2007
EP 0996173 A2 4/2000
(Continued)

OTHER PUBLICATIONS

Office Action dated Oct. 7, 2021 for U.S. Appl. No. 16/550,947.
(Continued)

*Primary Examiner* — Stefanie J Cohen
*Assistant Examiner* — Ritu S Shirali
(74) *Attorney, Agent, or Firm* — Patterson & Sheridan, LLP

(57) ABSTRACT

Embodiments of the present disclosure include techniques related to techniques for processing materials for manufacture of group-III metal nitride and gallium based substrates. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic and electronic devices, lasers, light emitting diodes, solar cells, photo electrochemical water splitting and hydrogen generation, photodetectors, integrated circuits, and transistors, and others.

24 Claims, 20 Drawing Sheets

(51) Int. Cl.
    *C30B 29/40*   (2006.01)
    *H01L 29/20*   (2006.01)
    *H01L 21/02*   (2006.01)
    *C30B 33/10*   (2006.01)
    *H01L 29/778*  (2006.01)
    *H01L 33/32*   (2010.01)

(52) U.S. Cl.
    CPC ............ *C30B 29/406* (2013.01); *C30B 33/10* (2013.01); *H01L 21/0254* (2013.01); *H01L 21/02642* (2013.01); *H01L 21/02647* (2013.01); *H01L 29/2003* (2013.01); *H01L 29/7788* (2013.01); *H01L 33/32* (2013.01)

(58) Field of Classification Search
    CPC ......... H01L 21/02609; H01L 21/02647; H01L 29/2003; H01L 33/007; H01L 33/32; H01L 21/02389
    USPC ....................................................... 117/20
    See application file for complete search history.

(56) References Cited

U.S. PATENT DOCUMENTS

| | | | |
|---|---|---|---|
| 4,066,868 A | 1/1978 | Witkin et al. |
| 4,350,560 A | 9/1982 | Helgeland et al. |
| 4,870,045 A | 9/1989 | Gasper et al. |
| 5,098,673 A | 3/1992 | Engel et al. |
| 5,127,983 A | 7/1992 | Imai et al. |
| 5,169,486 A | 12/1992 | Young et al. |
| 5,474,021 A | 12/1995 | Tsuno et al. |
| 6,129,900 A | 10/2000 | Satoh et al. |
| 6,163,557 A | 12/2000 | Dunnrowicz et al. |
| 6,273,948 B1 | 8/2001 | Porowski et al. |
| 6,398,867 B1 | 6/2002 | D'Evelyn et al. |
| 6,406,540 B1 | 6/2002 | Harris et al. |
| 6,500,257 B1 | 12/2002 | Wang et al. |
| 6,528,427 B2 | 3/2003 | Chebi et al. |
| 6,562,127 B1 | 5/2003 | Kud |
| 6,596,079 B1 | 7/2003 | Vaudo et al. |
| 6,599,362 B2 | 7/2003 | Ashby et al. |
| 6,656,615 B2 | 12/2003 | Dwilinski et al. |
| 6,686,608 B1 | 2/2004 | Takahira |
| 6,756,246 B2 | 6/2004 | Hiramatsu et al. |
| 6,764,297 B2 | 7/2004 | Godwin et al. |
| 6,765,240 B2 | 7/2004 | Tischler et al. |
| 6,784,463 B2 | 8/2004 | Camras et al. |
| 6,787,814 B2 | 9/2004 | Udagawa |
| 6,805,745 B2 | 10/2004 | Snyder |
| 6,806,508 B2 | 10/2004 | D'Evelyn et al. |
| 6,818,529 B2 | 11/2004 | Bachrach et al. |
| 6,861,130 B2 | 3/2005 | D'Evelyn et al. |
| 6,887,144 B2 | 5/2005 | D'Evelyn et al. |
| 7,001,577 B2 | 2/2006 | Zimmerman et al. |
| 7,026,756 B2 | 4/2006 | Shimizu et al. |
| 7,053,413 B2 | 5/2006 | D'Evelyn et al. |
| 7,063,741 B2 | 6/2006 | D'Evelyn et al. |
| 7,078,731 B2 | 7/2006 | D'Evelyn et al. |
| 7,098,487 B2 | 8/2006 | D'Evelyn et al. |
| 7,101,433 B2 | 9/2006 | D'Evelyn et al. |
| 7,112,829 B2 | 9/2006 | Picard et al. |
| 7,119,372 B2 | 10/2006 | Stokes et al. |
| 7,125,453 B2 | 10/2006 | D'Evelyn et al. |
| 7,160,531 B1 | 1/2007 | Jacques et al. |
| 7,170,095 B2 | 1/2007 | Vaudo et al. |
| 7,175,704 B2 | 2/2007 | D'Evelyn et al. |
| 7,198,671 B2 | 4/2007 | Ueda |
| 7,220,658 B2 | 5/2007 | Haskell et al. |
| 7,252,712 B2 | 8/2007 | Dwilinski et al. |
| 7,279,040 B1 | 10/2007 | Wang |
| 7,316,746 B2 | 1/2008 | D'Evelyn et al. |
| 7,335,262 B2 | 2/2008 | Dwilinski et al. |
| 7,361,576 B2 | 4/2008 | Imer et al. |
| 7,368,015 B2 | 5/2008 | D'Evelyn et al. |
| 7,381,391 B2 | 6/2008 | Spencer et al. |
| 7,420,261 B2 | 9/2008 | Dwili ski et al. |
| 7,470,938 B2 | 12/2008 | Lee et al. |
| 7,569,206 B2 | 8/2009 | Spencer et al. |
| 7,625,446 B2 | 12/2009 | D'Evelyn et al. |
| 7,642,122 B2 | 1/2010 | Tysoe et al. |
| 7,704,324 B2 | 4/2010 | D'Evelyn et al. |
| 7,705,276 B2 | 4/2010 | Giddings et al. |
| 7,759,710 B1 | 7/2010 | Chiu et al. |
| 7,932,382 B2 | 4/2011 | Wang et al. |
| 7,935,382 B2 | 5/2011 | Park et al. |
| 7,976,630 B2 | 7/2011 | Poblenz et al. |
| 8,021,481 B2 | 9/2011 | D'Evelyn |
| 8,039,412 B2 | 10/2011 | Park et al. |
| 8,048,225 B2 | 11/2011 | Poblenz et al. |
| 8,097,081 B2 | 1/2012 | D'Evelyn |
| 8,148,180 B2 | 4/2012 | Felker et al. |
| 8,148,801 B2 | 4/2012 | D'Evelyn |
| 8,278,656 B2 | 10/2012 | Mattmann et al. |
| 8,303,710 B2 | 11/2012 | D'Evelyn |
| 8,306,081 B1 | 11/2012 | Schmidt et al. |
| 8,313,964 B2 | 11/2012 | Sharma et al. |
| 8,323,405 B2 | 12/2012 | D'Evelyn |
| 8,329,511 B2 | 12/2012 | D'Evelyn |
| 8,354,679 B1 | 1/2013 | D'Evelyn et al. |
| 8,430,958 B2 | 4/2013 | D'Evelyn |
| 8,435,347 B2 | 5/2013 | D'Evelyn et al. |
| 8,444,765 B2 | 5/2013 | D'Evelyn |
| 8,461,071 B2 | 6/2013 | D'Evelyn |
| 8,465,588 B2 | 6/2013 | Poblenz et al. |
| 8,482,104 B2 | 7/2013 | D'Evelyn et al. |
| 8,492,185 B1 | 7/2013 | D'Evelyn et al. |
| 9,012,306 B2 | 4/2015 | Beaumont et al. |
| 9,209,596 B1 | 12/2015 | McLaurin et al. |
| 9,589,792 B2 | 3/2017 | Jiang et al. |
| 9,650,723 B1 | 5/2017 | D'Evelyn et al. |
| 9,834,859 B2 | 12/2017 | Mori et al. |
| 10,094,017 B2 | 10/2018 | Pocius et al. |
| RE47,114 E | 11/2018 | D'Evelyn et al. |
| 10,400,352 B2 | 9/2019 | D'Evelyn et al. |
| 10,619,239 B2 | 4/2020 | Pocius et al. |
| 2001/0011935 A1 | 8/2001 | Lee et al. |
| 2002/0155691 A1 | 10/2002 | Lee et al. |
| 2002/0189532 A1 | 12/2002 | Motoki et al. |
| 2003/0027014 A1 | 2/2003 | Johnson et al. |
| 2003/0056718 A1 | 3/2003 | Kawahara et al. |
| 2003/0082466 A1 | 5/2003 | del Puerto et al. |
| 2003/0127041 A1 | 7/2003 | Xu et al. |
| 2003/0128041 A1 | 7/2003 | Byrd |
| 2003/0138732 A1 | 7/2003 | Nagase |
| 2003/0140845 A1 | 7/2003 | D'Evelyn et al. |
| 2003/0145784 A1 | 8/2003 | Thompson et al. |
| 2003/0183155 A1 | 10/2003 | D'Evelyn et al. |
| 2003/0209191 A1 | 11/2003 | Purdy |
| 2003/0232512 A1 | 12/2003 | Dickinson et al. |
| 2004/0000266 A1 | 1/2004 | D'Evelyn et al. |
| 2004/0007763 A1 | 1/2004 | Cunningham |
| 2004/0023427 A1 | 2/2004 | Chua et al. |
| 2004/0124435 A1 | 7/2004 | D'Evelyn et al. |
| 2004/0245535 A1 | 12/2004 | D'Evelyn et al. |
| 2005/0087753 A1 | 4/2005 | D'Evelyn et al. |
| 2005/0093003 A1 | 5/2005 | Shibata |
| 2005/0098095 A1 | 5/2005 | D'Evelyn et al. |
| 2005/0118349 A1 | 6/2005 | Whitehead et al. |
| 2005/0128469 A1 | 6/2005 | Hall et al. |
| 2005/0152820 A1 | 7/2005 | D'Evelyn et al. |
| 2005/0170611 A1 | 8/2005 | Ghyselen et al. |
| 2005/0205215 A1 | 9/2005 | Giddings et al. |
| 2006/0032428 A1 | 2/2006 | Dwilinski et al. |
| 2006/0037529 A1 | 2/2006 | D'Evelyn et al. |
| 2006/0037530 A1 | 2/2006 | Dwilinski et al. |
| 2006/0048699 A1 | 3/2006 | D'Evelyn et al. |
| 2006/0084245 A1 | 4/2006 | Kohda |
| 2006/0096521 A1 | 5/2006 | D'Evelyn et al. |
| 2006/0124051 A1 | 6/2006 | Yoshioka et al. |
| 2006/0177362 A1 | 8/2006 | D'Evelyn et al. |
| 2006/0207497 A1 | 9/2006 | D'Evelyn et al. |
| 2006/0213429 A1 | 9/2006 | Motoki et al. |
| 2006/0228870 A1 | 10/2006 | Oshima |
| 2006/0228901 A1 | 10/2006 | Yoon et al. |

(56) References Cited

U.S. PATENT DOCUMENTS

| | | |
|---|---|---|
| 2006/0255341 A1 | 11/2006 | Pinnington et al. |
| 2006/0288927 A1 | 12/2006 | Chodelka et al. |
| 2007/0012943 A1 | 1/2007 | Okahisa et al. |
| 2007/0057337 A1 | 3/2007 | Kano et al. |
| 2007/0105351 A1 | 5/2007 | Motoki et al. |
| 2007/0131967 A1 | 6/2007 | Kawaguchi et al. |
| 2007/0138505 A1 | 6/2007 | Preble et al. |
| 2007/0141819 A1 | 6/2007 | Park et al. |
| 2007/0142204 A1 | 6/2007 | Park et al. |
| 2007/0151509 A1 | 7/2007 | Park et al. |
| 2007/0158785 A1 | 7/2007 | D'Evelyn et al. |
| 2007/0178039 A1 | 8/2007 | D'Evelyn et al. |
| 2007/0181056 A1 | 8/2007 | D'Evelyn et al. |
| 2007/0197004 A1 | 8/2007 | Dadgar et al. |
| 2007/0210074 A1 | 9/2007 | Maurer et al. |
| 2007/0215033 A1 | 9/2007 | Imaeda et al. |
| 2007/0215887 A1 | 9/2007 | D'Evelyn et al. |
| 2007/0218703 A1 | 9/2007 | Kaeding et al. |
| 2007/0231978 A1 | 10/2007 | Kanamoto et al. |
| 2007/0234946 A1 | 10/2007 | Hashimoto et al. |
| 2007/0252164 A1 | 11/2007 | Zhong et al. |
| 2007/0264733 A1 | 11/2007 | Choi et al. |
| 2007/0274359 A1 | 11/2007 | Takeuchi et al. |
| 2008/0006831 A1 | 1/2008 | Ng |
| 2008/0025360 A1 | 1/2008 | Eichler et al. |
| 2008/0056984 A1 | 3/2008 | Yoshioka et al. |
| 2008/0083741 A1 | 4/2008 | Giddings et al. |
| 2008/0083970 A1 | 4/2008 | Kamber et al. |
| 2008/0087919 A1 | 4/2008 | Tysoe et al. |
| 2008/0096470 A1 | 4/2008 | Hou et al. |
| 2008/0156254 A1 | 7/2008 | Dwilinski et al. |
| 2008/0193363 A1 | 8/2008 | Tsuji |
| 2008/0272462 A1 | 11/2008 | Shimamoto et al. |
| 2009/0092536 A1 | 4/2009 | Kawabata et al. |
| 2009/0140287 A1 | 6/2009 | Fujiwara et al. |
| 2009/0170286 A1 | 7/2009 | Tsukamoto et al. |
| 2009/0218593 A1 | 9/2009 | Kamikawa et al. |
| 2009/0236694 A1 | 9/2009 | Mizuhara et al. |
| 2009/0250686 A1 | 10/2009 | Sato et al. |
| 2009/0298265 A1 | 12/2009 | Fujiwara |
| 2009/0301387 A1 | 12/2009 | D'Evelyn |
| 2009/0301388 A1 | 12/2009 | D'Evelyn |
| 2009/0309105 A1 | 12/2009 | Letts et al. |
| 2009/0309110 A1 | 12/2009 | Raring et al. |
| 2009/0320744 A1 | 12/2009 | D' Evelyn |
| 2009/0320745 A1 | 12/2009 | D'Evelyn et al. |
| 2010/0001300 A1 | 1/2010 | Raring et al. |
| 2010/0003492 A1 | 1/2010 | D'Evelyn |
| 2010/0003942 A1 | 1/2010 | Ikeda et al. |
| 2010/0025656 A1 | 2/2010 | Raring et al. |
| 2010/0031872 A1 | 2/2010 | D'Evelyn |
| 2010/0031873 A1 | 2/2010 | D'Evelyn |
| 2010/0031874 A1 | 2/2010 | D'Evelyn |
| 2010/0031875 A1 | 2/2010 | D'Evelyn |
| 2010/0031876 A1 | 2/2010 | D'Evelyn |
| 2010/0065854 A1 | 3/2010 | Kamber et al. |
| 2010/0075175 A1 | 3/2010 | Poblenz et al. |
| 2010/0104495 A1 | 4/2010 | Kawabata et al. |
| 2010/0108985 A1 | 5/2010 | Chung et al. |
| 2010/0109126 A1 | 5/2010 | Arena |
| 2010/0147210 A1 | 6/2010 | D'Evelyn |
| 2010/0151194 A1 | 6/2010 | D'Evelyn |
| 2010/0187568 A1 | 7/2010 | Arena |
| 2010/0189981 A1 | 7/2010 | Poblenz et al. |
| 2010/0219505 A1 | 9/2010 | D'Evelyn |
| 2010/0243988 A1 | 9/2010 | Kamikawa et al. |
| 2011/0062415 A1 | 3/2011 | Ohta et al. |
| 2011/0064103 A1 | 3/2011 | Ohta et al. |
| 2011/0068347 A1 | 3/2011 | Strittmatter |
| 2011/0100291 A1 | 5/2011 | D'Evelyn |
| 2011/0101400 A1 | 5/2011 | Chu et al. |
| 2011/0101414 A1 | 5/2011 | Thompson et al. |
| 2011/0124139 A1 | 5/2011 | Chang |
| 2011/0158275 A1 | 6/2011 | Yoshizumi et al. |
| 2011/0175200 A1 | 7/2011 | Yoshida |
| 2011/0183498 A1 | 7/2011 | D'Evelyn |
| 2011/0186860 A1 | 8/2011 | Enya et al. |
| 2011/0220912 A1 | 9/2011 | D'Evelyn |
| 2011/0256693 A1 | 10/2011 | D'Evelyn et al. |
| 2011/0260189 A1 | 10/2011 | Kim |
| 2011/0309373 A1 | 12/2011 | Sharma et al. |
| 2012/0000415 A1 | 1/2012 | D'Evelyn et al. |
| 2012/0091465 A1 | 4/2012 | Krames et al. |
| 2012/0104359 A1 | 5/2012 | Felker et al. |
| 2012/0104412 A1 | 5/2012 | Zhong et al. |
| 2012/0112320 A1 | 5/2012 | Kubo et al. |
| 2012/0118223 A1 | 5/2012 | D'Evelyn |
| 2012/0119218 A1 | 5/2012 | Su |
| 2012/0137966 A1 | 6/2012 | D'Evelyn et al. |
| 2012/0187412 A1 | 7/2012 | D'Evelyn et al. |
| 2013/0112987 A1 | 5/2013 | Fu et al. |
| 2013/0119401 A1 | 5/2013 | D'Evelyn et al. |
| 2013/0126902 A1 | 5/2013 | Isozaki et al. |
| 2013/0251615 A1 | 9/2013 | D'Evelyn et al. |
| 2013/0323490 A1 | 12/2013 | D'Evelyn et al. |
| 2014/0050244 A1 | 2/2014 | Ohno et al. |
| 2014/0065360 A1 | 3/2014 | D'Evelyn et al. |
| 2014/0147650 A1 | 5/2014 | Jiang et al. |
| 2014/0217553 A1 | 8/2014 | Arena et al. |
| 2017/0263815 A1* | 9/2017 | Iwai ................... H01L 33/32 |
| 2017/0362739 A1 | 12/2017 | Kajimoto et al. |
| 2018/0087185 A1 | 3/2018 | Yoshida |
| 2018/0202067 A1 | 7/2018 | Hirao et al. |
| 2019/0189439 A1 | 6/2019 | Mikawa et al. |
| 2020/0087813 A1 | 3/2020 | D'Evelyn et al. |
| 2020/0224331 A1 | 7/2020 | D'Evelyn et al. |

FOREIGN PATENT DOCUMENTS

| | | |
|---|---|---|
| JP | 2005-289797 A | 10/2005 |
| JP | 2005-298269 A | 10/2005 |
| JP | 2006-315947 A | 11/2006 |
| JP | 2007-039321 A | 2/2007 |
| JP | 2016037426 A | 3/2016 |
| JP | 2016038756 A | 5/2016 |
| WO | 2004/061923 A1 | 7/2004 |
| WO | 2005/121415 A1 | 12/2005 |
| WO | 2006/038467 A1 | 4/2006 |
| WO | 2006/057463 A1 | 6/2006 |
| WO | 2007/004495 A1 | 1/2007 |
| WO | 2010/068916 A1 | 6/2010 |
| WO | 2011/044554 A1 | 4/2011 |
| WO | 2012/016033 A1 | 2/2012 |

OTHER PUBLICATIONS

Office Action dated Jan. 27, 2022 for U.S. Appl. No. 16/550,947.
"Semiconductor Wafer Bonding" by Q.-Y. Tong and U. Gosele.
Mark P. D'Evelyn, Large Area Gallium Nitride Crystal and Method for Making, U.S. Appl. No. 12/635,645.
International Search Report dated May 6, 2021 for Application No. PCT/US2021/017514.
Tapajna et al., Applied Physics Letters, 2011, 99(22), 223501-223503Tapajna et al., "Influence of threading dislocation density on early degradation in AlGaN/GaN high electron mobility transistors," Applied Physics Letters, 2011, vol. 99, pp. 223501.
Darakchieva et al., "Lattice parameters of bulk GaN fabricated by halide vapor phase epitaxy," Journal of Crystal Growth, 2008, vol. 310, pp. 959-965.
S. K. Mathis et al., "Modeling of threading dislocation reduction in growing GaN layers," Journal of Crystal Growth, 2001, vol. 231, pp. 371-390.
Sumiya et al., 'High-pressure synthesis of high-purity diamond crystal', Diamond and Related Materials, 1996, vol. 5, pp. 1359-1365.
Chakraborty et al., 'Defect Reduction in Nonpolar a-Plane GaN Films Using in situ SiNx Nanomask', Applied Physics Letters, vol. 89, 2006, pp. 041903-1-041903-3.
Davidsson et al., 'Effect of AlN Nucleation Layer on the Structural Properties of Bulk GaN Grown on Sapphire by Molecular-Beam Epitaxy', Journal of Applied Physics, vol. 98, No. 1, 2005, pp. 016109-1-016109-3.

(56) References Cited

OTHER PUBLICATIONS

Katona et al., 'Observation of Crystallographic Wing Tilt in Cantilever Epitaxy of GaN on Silicon Carbide and Silicon (111) Substrates', Applied Physics Letters, vol. 79, No. 18, 2001, pp. 2907-2909.
Nakamura et al., 'GaN Growth Using GaN Buffer Layer', Japanese Journal of Applied Physics, vol. 30, No. 10A, 1991, pp. L1705-L1707.
Sumiya et al., 'Growth Mode and Surface Morphology of a GaN Film Deposited Along the N-Face Polar Direction on c-Plane Sapphire Substrate', Journal of Applied Physics, vol. 88, No. 2, 2000, pp. 1158-1165.
Dwilinski et al., 'Ammono Method of BN, AlN and GaN Synthesis and Crystal Growth', MRS Internet Journal Nitride Semiconductor Research, vol. 3, No. 25, 1998, pp. 1-5.
Dwilinski et al., "Excellent crystallinity of truly bulk ammonothermal GaN", "Journal of Crystal Growth", vol. 310 (2008), pp. 3911-3916.
Hashimoto et al., 'A GaN bulk crystal with improved structural quality grown by the ammonothermal method', Nature Materials, vol. 6, 2007, pp. 568-671.
Hashimoto et al., 'Ammonothermal Growth of Bulk GaN', Journal of Crystal Growth, vol. 310, 2008, pp. 3907-3910.
Kolis et al., 'Materials Chemistry and Bulk Crystal Growth of Group III Nitrides in Supercritical Ammonia', Material Resources Society Symposium Proceedings, vol. 495, 1998, pp. 367-372.
Kolis et al., 'Crystal Growth of Gallium Nitride in Supercritical Ammonia', Journal of Crystal Growth, vol. 222, 2001, pp. 431-434.
Motoki et al., 'Growth and Characterization of Freestanding GaN Substrates', Journal of Crystal Growth, vol. 237-239, 2002, pp. 912-921.
Final Office Action dated Nov. 30, 2021 for U.S. Appl. No. 16/736,274.
Office Action dated Aug. 30, 2021 for U.S. Appl. No. 16/736,274.
Non-Final Office Action for U.S. Appl. No. 16/736,274 dated Apr. 5, 2022.
Cao et al., Microelectronics Reliability, 2003, 43(12), 1987-1991.
Schubert etal., Applied Physics Letters, 2007, 91(23), 231114.
Tomiya et al., IEEE Journal of Selected Topics in Quantum Electronics, 2004, 10(6), 1277-1286.
Orita et al., IEEE International Reliability Physics Symposium Proceedings, 2009, 736-740.
Kaun et al., Applied Physics Express, 2011, 4(2), 024101.
Tapajna et al., Applied Physics Letters, 2011, 99(22), 223501-223503.
Linthicum et al., Applied Physics Letters, 75, 196, (1999).
Chen et al., Applied Physics Letters 75, 2062 (1999).
Chen et al., Japanese Journal of Applied Physics 42, L818 (2003).
Sharma et al., Vertically oriented GaN-based air-gap distributed Bragg reflector structure fabricated using band-gap-selective photoelectrochemical etching, Applied Physics Letters 87, 051107 (2005), 3 pages.
Dorsaz et al., Selective oxidation of AlInN layers for current confinement in III-nitride devices, Applied Physics Letters 87, 072102 (2005), 3 pages.
Pattison et al., Gallium nitride based microcavity light emitting diodes with 2_ effective cavity thickness, Applied Physics Letters 90, 031111 (2007), 3 pages.
Choi et al., 2.5 _ microcavity InGaN light-emitting diodes fabricated by a selective dry-etch thinning process, Applied Physics Letters 91, 061120 (2007), 3 pages.
Altoukhov et al., High reflectivity airgap distributed Bragg reflectors realized by wet etching of AlInN sacrificial layers Applied Physics Letters 95, 1191102 (2009), 3 pages.
Tyagi et al., Partial strain relaxation via misfit dislocation generation at heterointerfaces in (Al,In)GaN epitaxial layers grown on semipolar (1122) GaN free standing substrates, Applied Physics Letters 95, 1191102 (2009), 3 pages.
Porowski et al., High resistivity GaN single crystalline substrates, APPA Vo. 92 (1997), 5 pages.
Oshima et al., Thermal and optical properties of bulk GaN crystals fabricated through hydride vapor phase epitaxy with void-assisted separation. Applied Physics Letters 98, 103509 (2005), 4 pages.
Wang et al., Ammonothermal growth of GaN crystals in alkaline solutions, Journal of Crystal Growth 287 (2006) pp. 376-380, 5 pages.
D'Evelyn et al., Bulk GaN crystal growth by the high-pressure ammonothermal method, Journal of Crystal Growth 300 (2007) pp. 11-16, 6 pages.
Fukuda et al., Prospects for the ammonothermal growth of large GaN crystal, Journal of Crystal Growth 305 (2007) pp. 304-310, 7 pages.
Gladkov et al., Effect of Fe doping on optical properties of free-standing semi-insulating HVPE GaN:Fe, Journal of Crystal Growth 312 (2010) pp. 1205-1209, 5 pages.
Moutanabbir et al., Bulk GaN Ion Cleaving, Journal of Electronic Materials, vol. 39, No. 5, (2010) pp. 482-488, 7 pages.
Grzegory, I., High pressure growth of bulk GaN from solutions in gallium, Journal of Physics: Condensed Matter, 13 (2001) pp. 6875-6892, 18 pages.
Fujito et al., Development of Bulk GaN Crystals and Nonpolar/Semipolar Substrates by HVPE, MRS Bulletin, vol. 34, May 2009, pp. 313-317, 5 pages.
Callahan et al., Synthesis and Growth of Gallium Nitride by the Chemical Vapor Reaction Process (CVRP), MRS Internet J. Nitride Semicond. Res. 4, 10 (1999), pp. 1-6, 6 pages.
Porowski, S., Near defect free GaN substrates, Published online by Cambridge University Press, Jun. 13, 2014, 11 pages.
Ehrentraut et al.,The Ammonothermal Crystal Growth of Gallium NitrideVA Technique on the Up Rise, Proceedings of the IEEE, vol. 0, No. 0, 2009, pp. 1-8, 8 pages.
Weisbuch et al., Recent results and latest views on microcavity LEDs, Proc. of SPIE, vol. 5366, 2009, pp. 1-19, 19 pages.
Fang et al., Deep centers in semi-insulating Fe-doped native GaN substrates grown by hydride vapour phase epitaxy, phys. stat. sol. (c) 5, No. 6, pp. 1508-1511 (2008), 4 pages.
International Search Report dated Nov. 2, 2020 for Application No. PCT/US2020/034405).

* cited by examiner

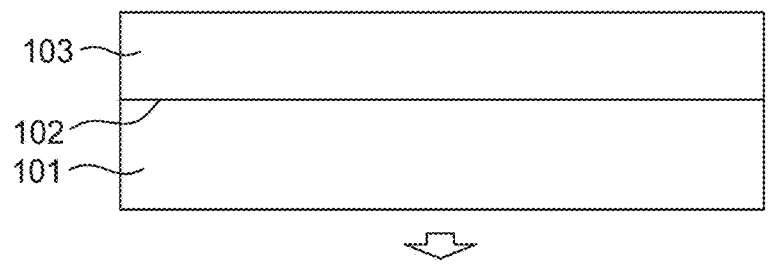
FIG. 1A
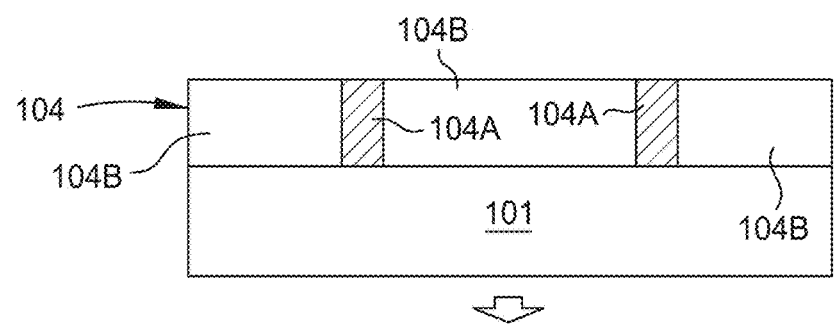
FIG. 1B
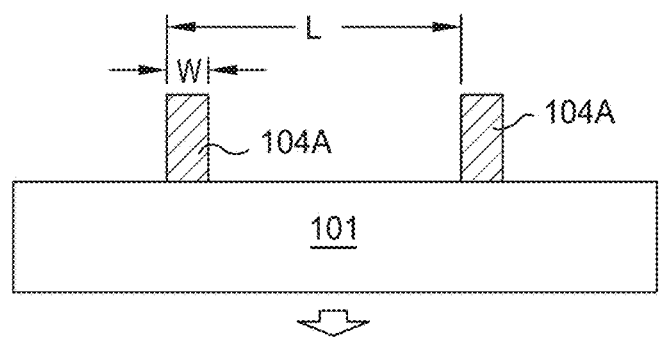
FIG. 1C
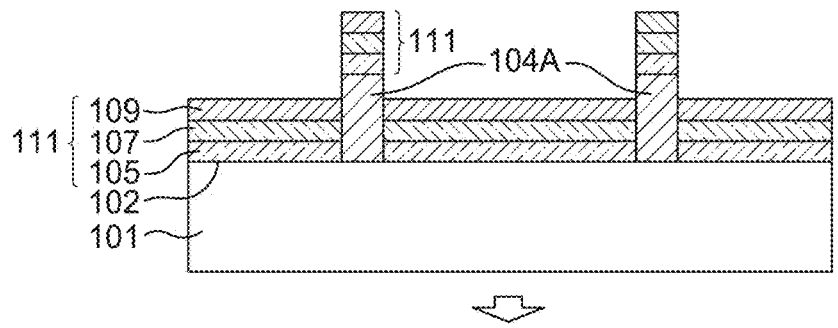
FIG. 1D
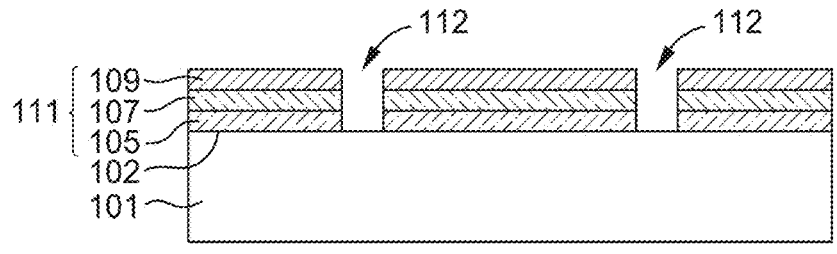
FIG. 1E
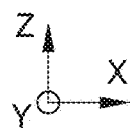

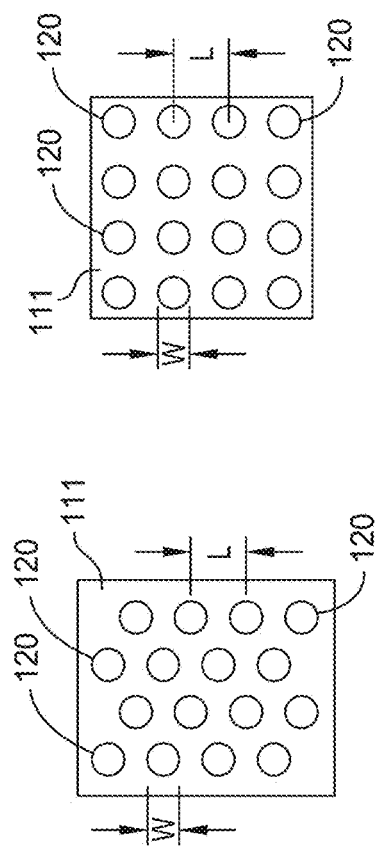
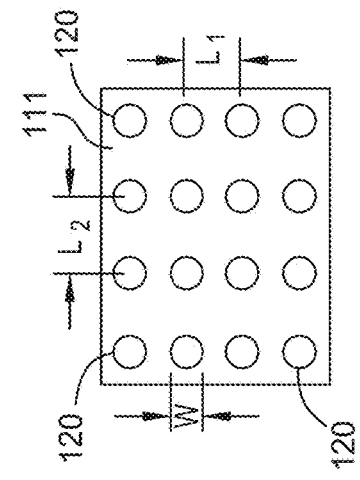
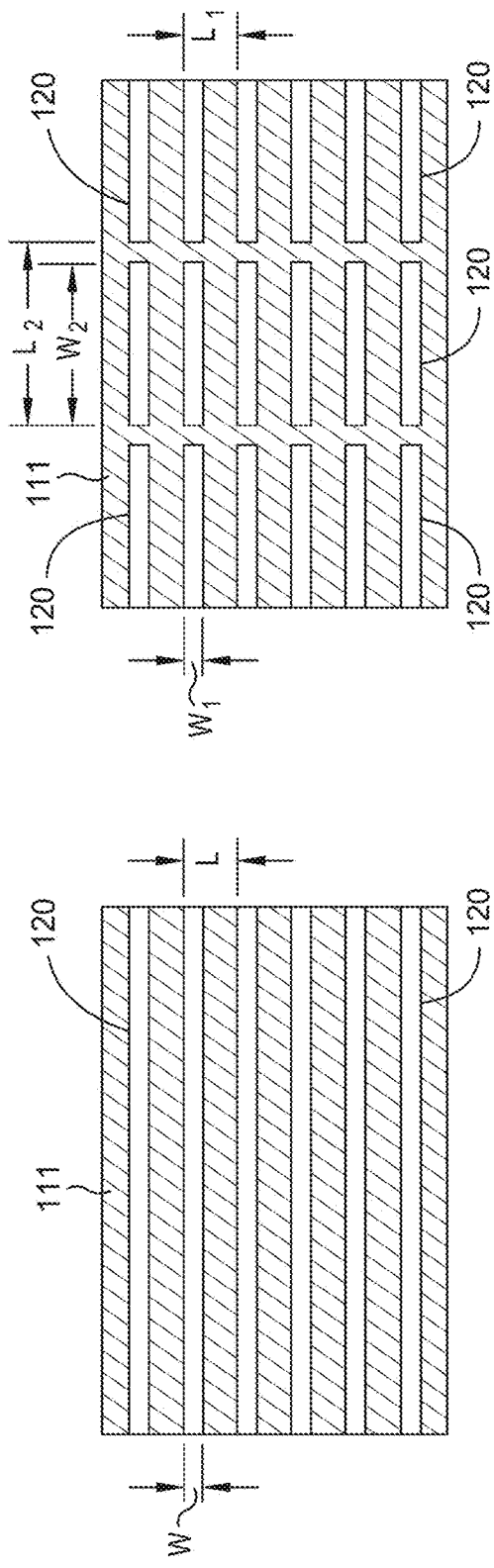
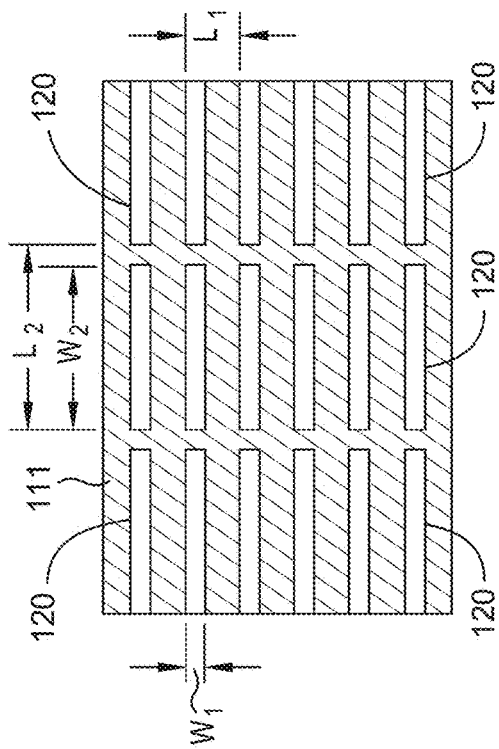

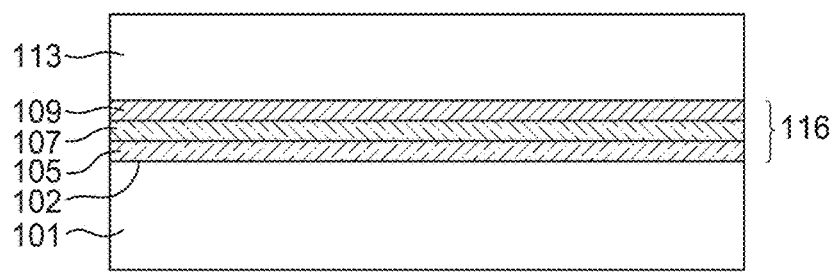
FIG. 1M
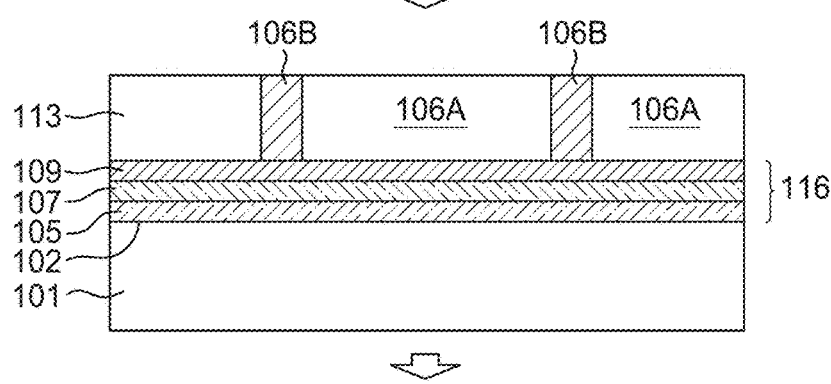
FIG. 1N
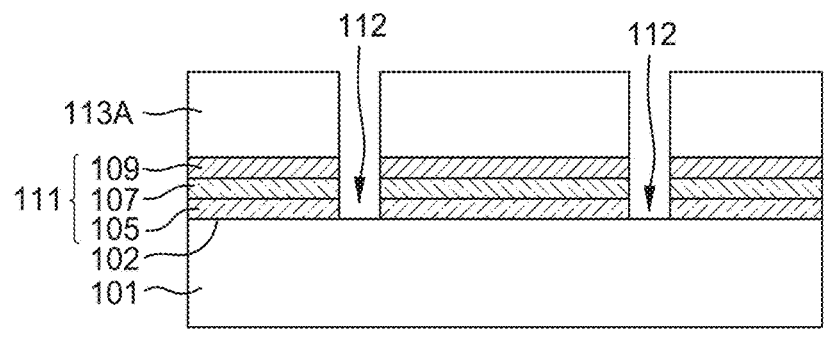
FIG. 1O
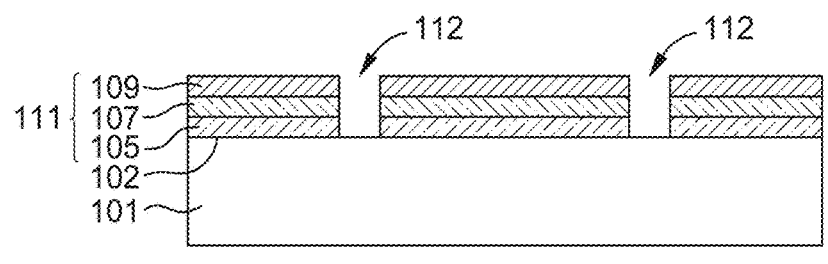
FIG. 1P
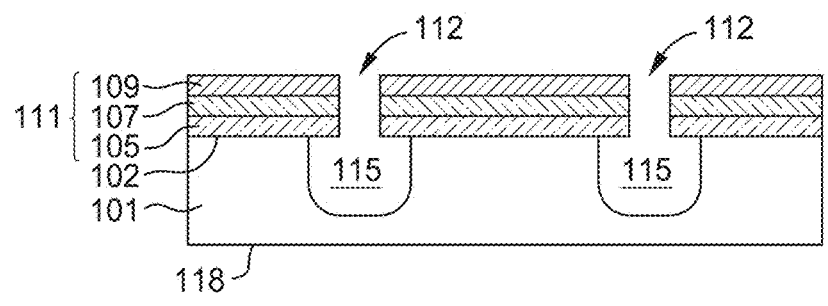
FIG. 1Q
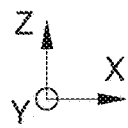

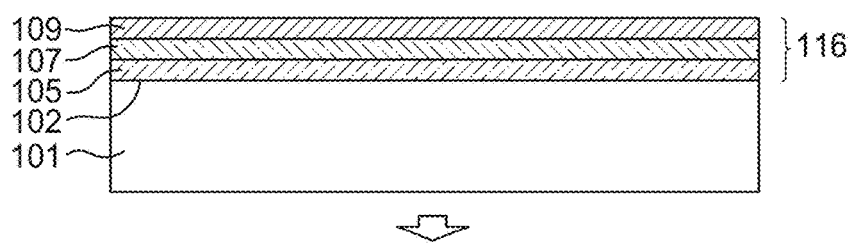
FIG. 1R
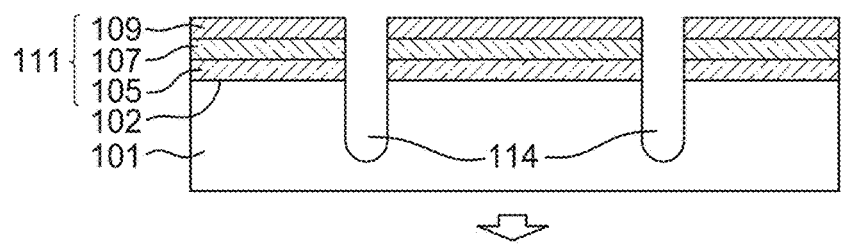
FIG. 1S
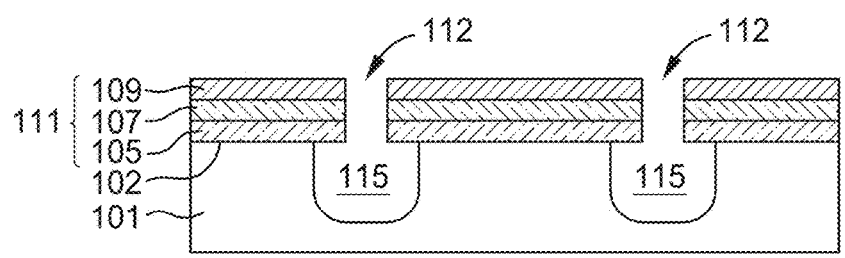
FIG. 1T
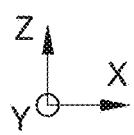

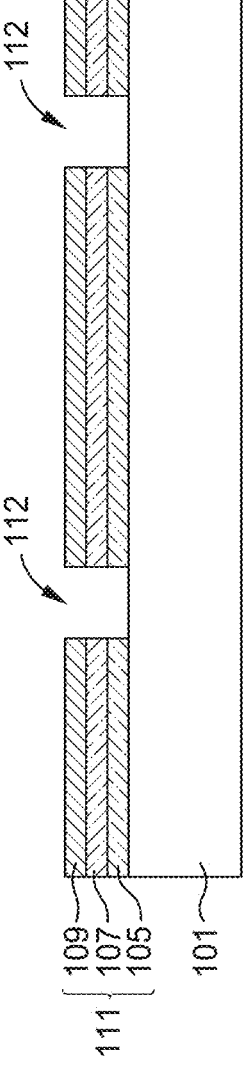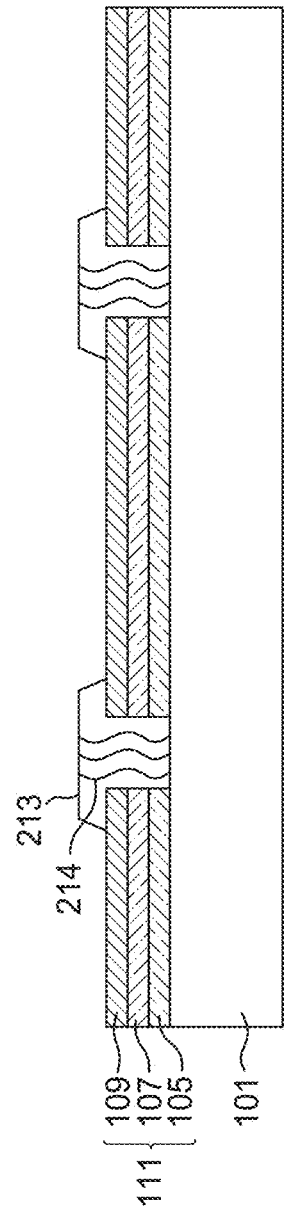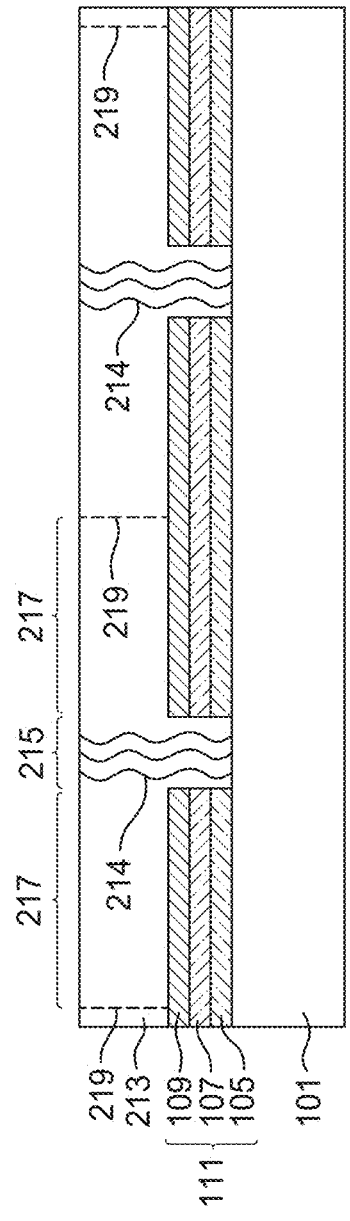

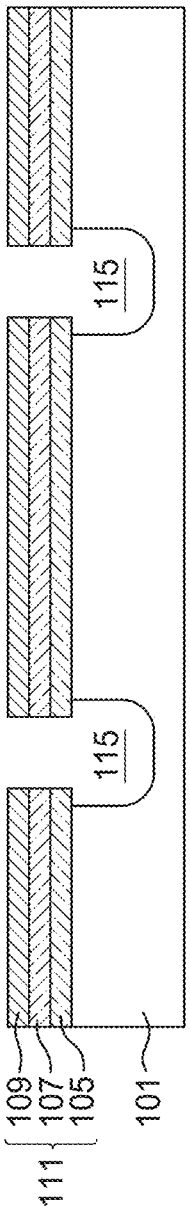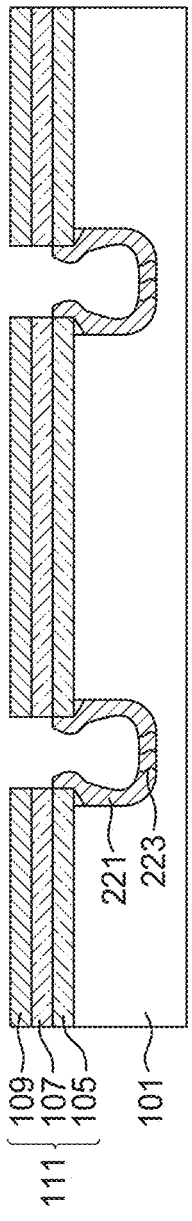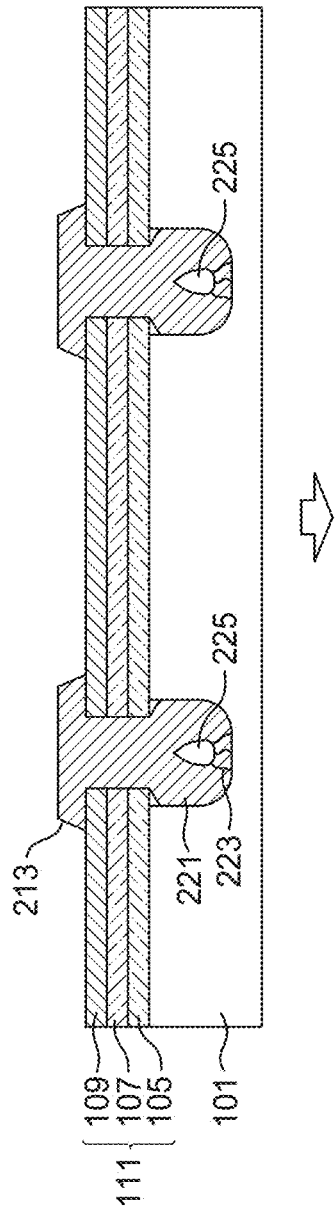

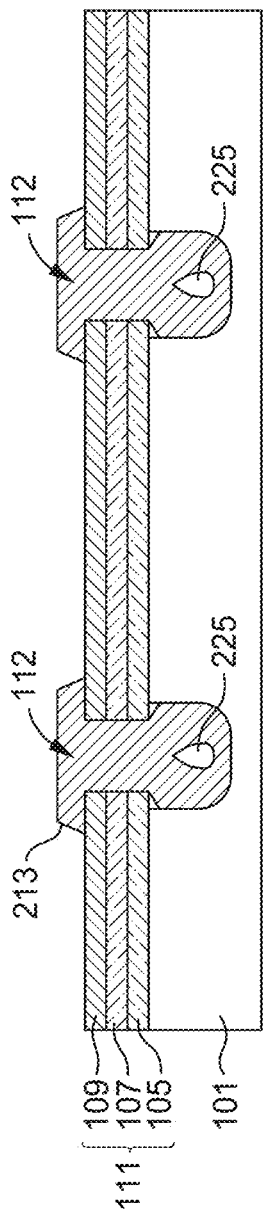
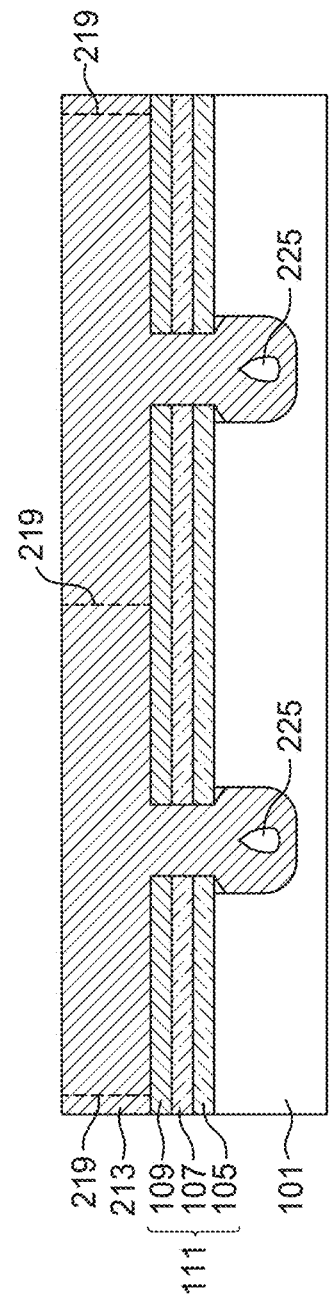
FIG. 3D
FIG. 3E

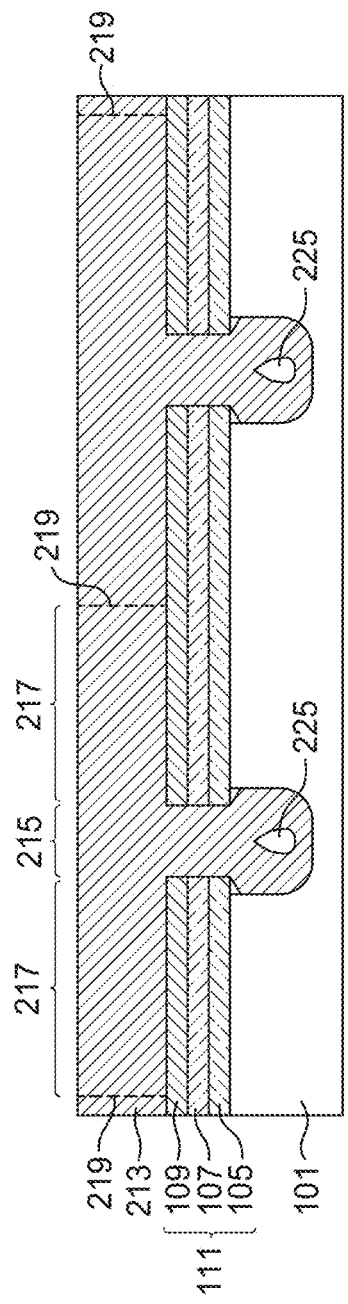
FIG. 3F
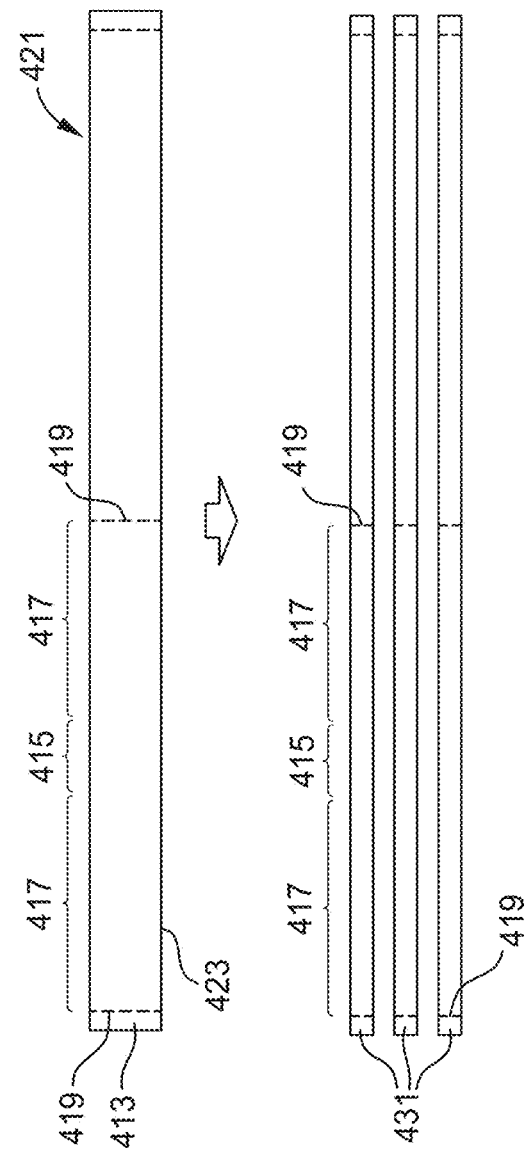
FIG. 4A
FIG. 4B

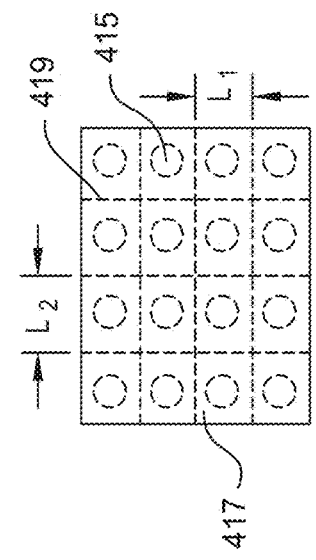
2D HEXAGONAL PATTERN
FIG. 5A
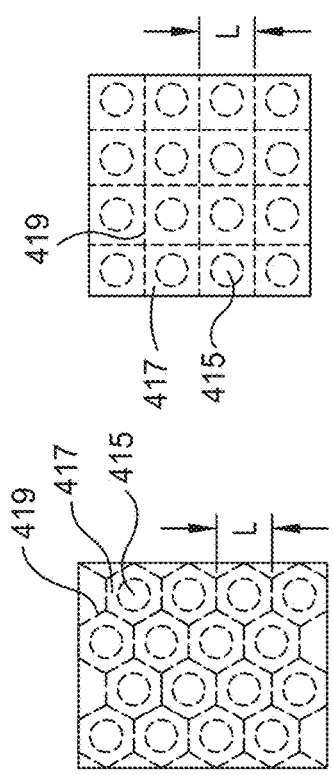
2D SQUARE PATTERN
FIG. 5B
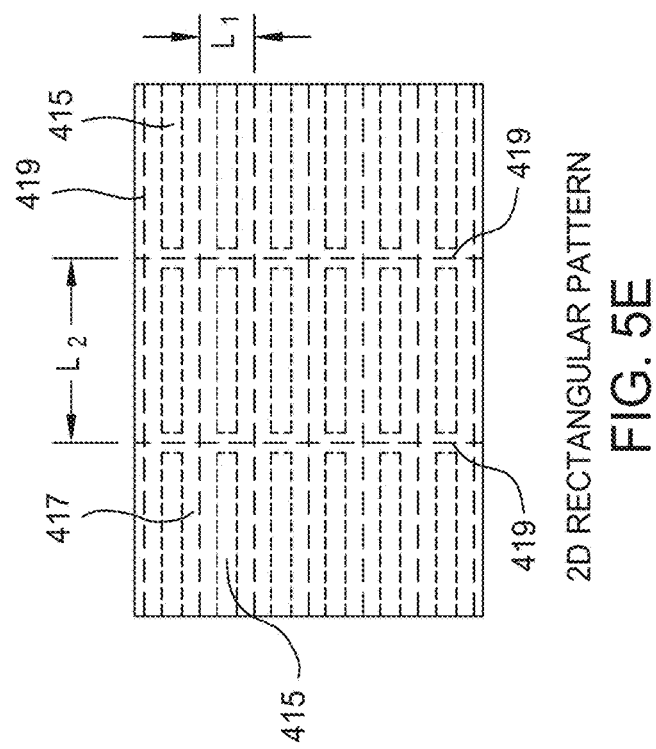
2D RECTANGULAR PATTERN
FIG. 5C
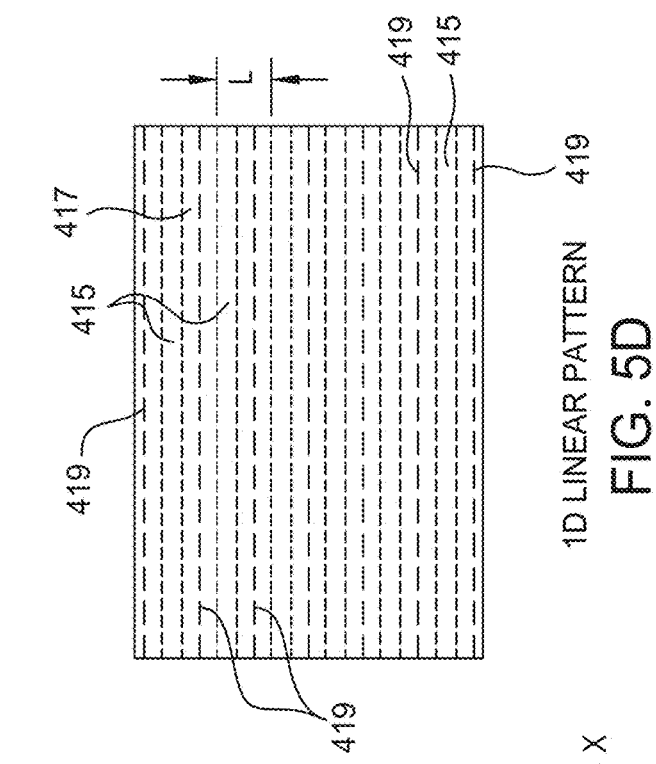
1D LINEAR PATTERN
FIG. 5D
2D RECTANGULAR PATTERN
FIG. 5E

GROUP III NITRIDE SUBSTRATE, METHOD OF MAKING, AND METHOD OF USE

CROSS-REFERENCE TO RELATED APPLICATIONS

This application claims the benefit to U.S. provisional application No. 62/975,078, filed Feb. 11, 2020, which is incorporated by reference herein.

BACKGROUND

Field

This disclosure relates generally to techniques for processing materials for manufacture of gallium-containing nitride substrates and utilization of these substrates in optoelectronic and electronic devices. More specifically, embodiments of the disclosure include techniques for growing large area substrates using a combination of processing techniques.

Description of the Related Art

Gallium nitride (GaN) based optoelectronic and electronic devices are of tremendous commercial importance. The quality and reliability of these devices, however, is compromised by high defect levels, particularly threading dislocations, grain boundaries, and strain in semiconductor layers of the devices. Threading dislocations can arise from lattice mismatch of GaN based semiconductor layers to a non-GaN substrate such as sapphire or silicon carbide. Grain boundaries can arise from the coalescence fronts of epitaxially-overgrown layers. Additional defects can arise from thermal expansion mismatch, impurities, and tilt boundaries, depending on the details of the growth of the layers.

The presence of defects has deleterious effects on epitaxially-grown layers. Such effects include compromising electronic device performance. To overcome these defects, techniques have been proposed that require complex, tedious fabrication processes to reduce the concentration and/or impact of the defects. While a substantial number of conventional growth methods for gallium nitride crystals have been proposed, limitations still exist. That is, conventional methods still merit improvement to be cost effective and efficient.

Progress has been made in the growth of large-area gallium nitride crystals with considerably lower defect levels than heteroepitaxial GaN layers. However, most techniques for growth of large-area GaN substrates involve GaN deposition on a non-GaN substrate, such as sapphire or GaAs. This approach generally gives rise to threading dislocations at average concentrations of $10^5$-$10^7$ cm$^{-2}$ over the surface of thick boules, as well as significant bow, stress, and strain. Reduced concentrations of threading dislocations are desirable for a number of applications. Bow, stress, and strain can cause low yields when slicing the boules into wafers, make the wafers susceptible to cracking during down-stream processing, and may also negatively impact device reliability and lifetime. Another consequence of the bow, stress, and strain is that, during growth in m-plane and semipolar directions, even by near-equilibrium techniques such as ammonothermal growth, significant concentrations of stacking faults may be generated. In addition, the quality of c-plane growth may be unsatisfactory, due to formation of cracks, multiple crystallographic domains, and the like. Capability to manufacture substrates larger than 2 inches is currently very limited, as is capability to produce large-area GaN substrates with a nonpolar or semipolar crystallographic orientation. Most large area substrates are manufactured by vapor-phase methods, such as hydride vapor phase epitaxy (HVPE), which are relatively expensive. A less-expensive method is desired, while also achieving large area and low threading dislocation densities as quickly as possible.

Ammonothermal crystal growth has a number of advantages over HVPE as a means for manufacturing GaN boules. However, the performance of ammonothermal GaN crystal growth processing may be significantly dependent on the size and quality of seed crystals. Seed crystals fabricated by HVPE may suffer from many of the limitations described above, and large area ammonothermally-grown crystals are not widely available.

Lateral epitaxial overgrowth (LEO) is a method that has been widely applied to improvement in the crystallographic quality of films grown by vapor-phase methods. Several authors have disclosed methods for performing lateral growth from sidewalls of thin-film GaN layers on non-GaN substrates. However, to the best of our knowledge, analogous methods have not yet been disclosed for bulk growth of GaN, including ammonothermal growth, and the methods that have been disclosed for sidewall LEO of thin-film GaN are impractical for bulk GaN.

Due to at least the issues described above, there is a need for substrates that have a lower defect density and are formed by techniques that improve the crystal growth process. Also, from the above, it is seen that techniques for improving crystal growth are highly desirable.

SUMMARY

Embodiments of the present disclosure include a free-standing group III metal nitride crystal. The free-standing crystal comprises a wurtzite crystal structure, a first surface having a maximum dimension greater than 40 millimeters in a first direction, an average concentration of stacking faults below $10^3$ cm$^{-1}$; an average concentration of threading dislocations between $10^1$ cm$^{-2}$ and $10^6$ cm$^{-2}$, wherein the average concentration of threading dislocations on the first surface varies periodically by at least a factor of two in the first direction, the period of the variation in the first direction being between 5 micrometers and 20 millimeters, and a miscut angle that varies by 0.1 degree or less in the central 80% of the first surface of the crystal along the first direction and by 0.1 degree or less in the central 80% of the first surface of the crystal along a second direction orthogonal to the first direction. The first surface comprises a plurality of first regions, each of the plurality of first regions having a locally-approximately-linear array of threading dislocations with a concentration between 5 cm$^{-1}$ and $10^5$ cm$^{-1}$, the first surface further comprises a plurality of second regions, each of the plurality of second regions being disposed between an adjacent pair of the plurality of first regions and having a concentration of threading dislocations below $10^5$ cm$^{-2}$ and a concentration of stacking faults below $10^3$ cm$^{-1}$, and the first surface further comprises a plurality of third regions, each of the plurality of third regions being disposed within one of the plurality of second regions or between an adjacent pair of second and having a minimum dimension between 10 micrometers and 500 micrometers and threading dislocations with a concentration between $10^3$ cm$^{-2}$ and $10^8$ cm$^{-2}$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIGS. 1A, 1B, and 1C are simplified diagrams illustrating different stages of a method of forming a patterned photoresist layer on a seed crystal or a substrate according to an embodiment of the present disclosure.

FIGS. 1D and 1E are simplified diagrams illustrating a method of forming a patterned mask layer on a seed crystal or a substrate, according to an embodiment of the present disclosure.

FIGS. 1F, 1G, 1H, 1I, and 1J are top views of arrangements of openings in a patterned mask layer on a seed crystal or a substrate according to an embodiment of the present disclosure.

FIGS. 1M and 1N are simplified diagrams illustrating different stages of a method of forming a patterned photoresist layer on a seed crystal or a substrate according to an alternate embodiment of the present disclosure.

FIGS. 1O and 1P are simplified diagrams illustrating a method of forming a patterned mask layer on a seed crystal or a substrate, according to an alternate embodiment of the present disclosure.

FIG. 1Q is a simplified diagram illustrating a method of forming patterned trenches within a seed crystal or a substrate, according to an embodiment of the present disclosure.

FIGS. 1R, 1S, and 1T are simplified diagrams illustrating an alternative method of forming patterned trenches within a seed crystal or a substrate, according to an embodiment of the present invention.

FIGS. 2A, 2B, and 2C are simplified diagrams illustrating an epitaxial lateral overgrowth process for forming a large area group III metal nitride crystal, according to an embodiment of the present disclosure.

FIGS. 3A, 3B, and 3C are simplified diagrams illustrating an improved epitaxial lateral overgrowth process for forming a large area group III metal nitride crystal, according to an embodiment of the present disclosure.

FIGS. 3D, 3E, and 3F are simplified diagrams illustrating an improved epitaxial lateral overgrowth process for forming a large area group III metal nitride crystal, according to an embodiment of the present disclosure.

FIGS. 4A and 4B are simplified diagrams illustrating a method of forming a free-standing ammonothermal group III metal nitride boule and free-standing ammonothermal group III metal nitride wafers.

FIGS. 5A-5E are simplified diagrams illustrating threading dislocation patterns and regions on a free-standing ammonothermal group III metal nitride boule or wafer according to an embodiment of the present disclosure.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1K:
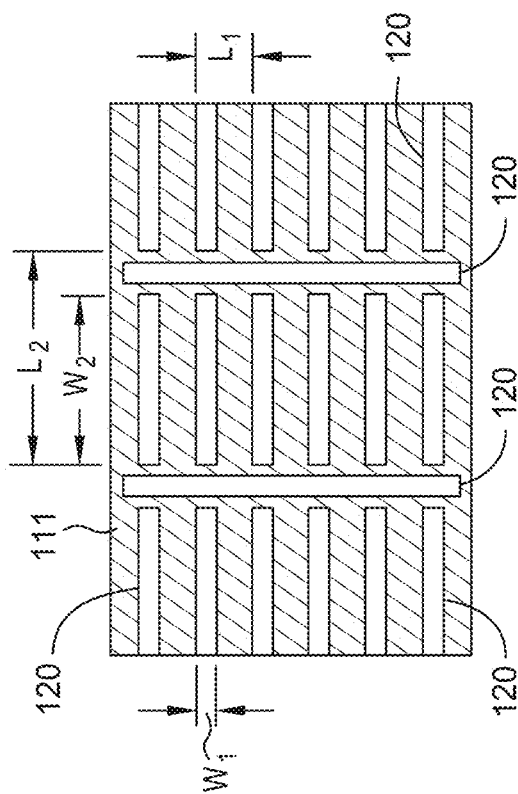
FIGS. 1K and 1L are top views of arrangements of openings in a patterned mask layer on a seed crystal or a substrate according to an embodiment of the present disclosure.

According to the present disclosure, techniques related to techniques for processing materials for manufacture of group-III metal nitride and gallium based substrates are provided. More specifically, embodiments of the disclosure include techniques for growing large area substrates using a combination of processing techniques. Merely by way of example, the disclosure can be applied to growing crystals of GaN, AlN, InN, InGaN, AlGaN, and AlInGaN, and others for manufacture of bulk or patterned substrates. Such bulk or patterned substrates can be used for a variety of applications including optoelectronic devices, lasers, light emitting diodes, solar cells, photo electrochemical water splitting and hydrogen generation, photodetectors, integrated circuits, and transistors, and others.

Threading dislocations in GaN are known to act as strong non-radiative recombination centers which can severely limit the efficiency of GaN-based LEDs and laser diodes. Non-radiative recombination generates local heating which may lead to faster device degradation (Cao et al., *Microelectronics Reliability*, 2003, 43(12), 1987-1991). In high-power applications, GaN-based devices suffer from decreased efficiency with increasing current density, known as droop. There is evidence suggesting a correlation between dislocation density and the magnitude of droop in LEDs (Schubert et al., *Applied Physics Letters*, 2007, 91(23), 231114). For GaN-based laser diodes there is a well-documented negative correlation between dislocation density and mean time to failure (MTTF) (Tom iya et al., *IEEE Journal of Selected Topics in Quantum Electronics*, 2004, 10(6), 1277-1286), which appears to be due to impurity diffusion along the dislocations (Orita et al., *IEEE International Reliability Physics Symposium Proceedings*, 2009, 736-740). For electronic devices, dislocations have been shown to markedly increase the leakage current (Kaun et al., *Applied Physics Express*, 2011, 4(2), 024101) and reduce the device lifetime (Tapajna et al., *Applied Physics Letters*, 2011, 99(22), 223501-223503) in HEMT structures. One of the primary advantages of using bulk GaN as a substrate material for epitaxial thin film growth is a large reduction in the concentration of threading dislocations in the film. Therefore, the dislocation density in the bulk GaN substrate will have a significant impact on the device efficiency and the reliability.

As noted above, lateral epitaxial overgrowth (LEO) is a method that has been widely applied to improvement in the crystallographic quality of films grown by vapor-phase methods. For example, methods whereby GaN layers were nucleated on a sapphire substrate, a $SiO_2$ mask with a periodic array of openings was deposited on the GaN layer, and then GaN was grown by metalorganic chemical vapor deposition (MOCVD) through the openings in the $SiO_2$ mask layer, grew laterally over the mask, and coalesced. The dislocation density in the areas above the openings in the mask were very high, similar to the layer below the mask, but the dislocation density in the laterally-overgrown regions was orders of magnitude less. This method is attractive because it can be applied to large area substrates, significantly reducing their dislocation density. Similar methods, with variations, have been applied by a number of groups to vapor-phase growth of GaN layers. These methods are variously referred to as LEO, epitaxial lateral overgrowth (ELO or ELOG), selective area growth (SAG), and dislocation elimination by epitaxial growth with inverse pyramidal pits (DEEP), or the like. In the case of essentially all variations of this method, it is believed that a thin heteroepitaxial GaN layer is grown on a non-GaN substrate, a patterned mask is deposited on the GaN layer, and growth is re-initiated in a one-dimensional or two-dimensional array of openings in the mask. The period or pitch of the growth locations defined by the openings in the mask is typically between 2 and 100 micrometers, typically between about 5 and 20 micrometers. The individual GaN crystallites or regions grow and then coalesce. Epitaxial growth may then be continued on top of the coalesced GaN material to produce a thick film or "ingot." A relatively thick GaN layer may be deposited on the coalesced GaN material by HVPE. The LEO process is capable of large reductions in the concentration of dislocations, particularly in the regions above the mask, typically to levels of about $10^5$-$10^7$ cm$^{-2}$. However, very often the laterally-grown wings of the formed LEO layer are crystallographically tilted from the underlying substrate ("wing tilt"), by as much as several degrees, which may be acceptable for a thin-film process but may not be acceptable for a bulk crystal growth process, as it may give rise to stresses and cracking as well as unacceptable variation in surface crystallographic orientation.

Several factors limit the capability of the LEO method, as conventionally applied, to reduce the average dislocation density below about $10^5$ to $10^7$ cm$^{-2}$, or to reduce the miscut variation across a 50 or 100 mm wafer to below about 0.1 degree. First, the pitch of the pattern of openings formed in the mask layer tends to be modest, but larger pitches may be desirable for certain applications. Second, c-plane LEO growth is generally performed in the (0001), or Ga-face direction, which creates at least two limitations. One limitation is that M-direction growth rates tend to be lower than those of (0001)-direction growth rates and semipolar (10-11) facets often form, with the consequence that the overall crystal diameter decreases with increasing thickness and making coalescence of large-pitch patterns difficult. In addition, another limitation is that growth in the (0001) direction tends to exclude oxygen, in contrast to growth in other crystallographic directions. As a consequence, there may be a significant lattice mismatch between a (0001)-grown HVPE crystal used as a seed and the crystal grown upon it by another technique. In addition, if semipolar facets form during the LEO process there may be a significant variation in oxygen (or other dopant) level, giving rise to lateral variations in the lattice constant and stresses that can cause cracking in the LEO crystal itself or in a crystal grown on the latter, used as a seed.

Variations of the LEO method have been disclosed for other group III metal nitride growth techniques besides HVPE. In a first example, Jiang, et al. (U.S. No. 2014/0147650, now U.S. Pat. No. 9,589,792) disclosed a process for ammonothermal LEO growth of group-III metal nitrides, replacing the mask layer in typical vapor-phase LEO-type processes ($SiO_2$ or $SiN_x$) by a combination of an adhesion layer, a diffusion-barrier layer, and an inert layer. In a second example, Mori, et al. (U.S. No. 2014/0328742, now U.S. Pat. No. 9,834,859) disclosed a process for LEO growth of group-III metal nitrides in a sodium-gallium flux. However, in this method the coalescing crystallites typically have prominent semipolar facets, leading to significant lateral variation in the impurity content of coalesced crystals, and the thermal expansion mismatch between the coalesced nitride layer and a hetero-substrate, which includes a different material than the coalesced nitride layer, may cause uncontrolled cracking.

Several authors, for example, Linthicum et al. (*Applied Physics Letters*, 75, 196, (1999)), Chen et al. (*Applied Physics Letters* 75, 2062 (1999)), and Wang, et al. (U.S. Pat. No. 6,500,257) have noted that threading dislocations in growing GaN normally propagate predominantly in the growth direction and showed that the dislocation density can be reduced even more than in the conventional LEO method by growing from the sidewalls of trenches in thin, highly-defective c-plane GaN layers rather than vertically through windows in a patterned mask. These methods have been extended to nonpolar- and semipolar-oriented thin GaN films by other authors, for example, Chen et al. (*Japanese Journal of Applied Physics* 42, L818 (2003)) and Imer et al. (U.S. Pat. No. 7,361,576). However, to the best of the inventors' knowledge, sidewall LEO methods have not yet been extended to growth of bulk GaN, nor to the growth of N-sector GaN. In particular, we have found that different methods that those used in the thin film studies work best to form trenches several hundred microns deep with pitches on the millimeter scale and produce some unexpected benefits.

FIGS. 1A-1E are schematic cross-sectional views of a seed crystal or a substrate during various stages of a method for forming a patterned mask seed layer for ammonothermal sidewall lateral epitaxial overgrowth. Referring to FIG. 1A, a substrate 101 is provided with a photoresist layer 103 disposed thereon. In certain embodiments, substrate 101 consists of or includes a substrate material that is a single-crystalline group-III metal nitride, gallium-containing nitride, or gallium nitride. The substrate 101 may be grown by HVPE, ammonothermally, or by a flux method. One or both large area surfaces of substrate 101 may be polished and/or chemical-mechanically polished. A large-area surface 102 of substrate 101 may have a crystallographic orientation within 5 degrees, within 2 degrees, within 1 degree, or within 0.5 degree of (0001)+c-plane, (000-1)-c-plane, {10-10} m-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0-1±2}, {1 0-1±3}, {2 1-3±1}, or {3 0-3±4}. It will be understood that plane {3 0-3±4} means the {3 0-3 4} plane and the {3 0-3 -4} plane. Large-area surface 102 may have an (h k i l) semi-polar orientation, where i=-(h+k) and l and at least one of h and k are nonzero. Large-area surface 102 may have a maximum lateral dimension between about 5 millimeters and about 600 millimeters and a minimum lateral dimension between about 1 millimeter and about 600 millimeters and substrate 101 may have a thickness between about 10 micrometers and about 10 millimeters, or between about 100 micrometers and about 2 millimeters.

Substrate 101 may have a surface threading dislocation density less than about $10^7$ cm$^{-2}$, less than about $10^6$ cm$^{-2}$, less than about $10^5$ cm$^{-2}$, less than about $10^4$ cm$^{-2}$, less than about $10^3$ cm$^{-2}$, or less than about $10^2$ cm$^{-2}$. Substrate 101 may have a stacking-fault concentration below about $10^4$ cm$^{-1}$, below about $10^3$ cm$^{-1}$, below about $10^2$ cm$^{-1}$, below about 10 cm$^{-1}$ or below about 1 cm$^{-1}$. Substrate 101 may have a symmetric x-ray rocking curve full width at half maximum (FWHM) less than about 500 arcsec, less than about 300 arcsec, less than about 200 arcsec, less than about 100 arcsec, less than about 50 arcsec, less than about 35 arcsec, less than about 25 arcsec, or less than about 15 arcsec. Substrate 101 may have a crystallographic radius of curvature greater than 0.1 meter, greater than 1 meter, greater than 10 meters, greater than 100 meters, or greater than 1000 meters, in at least one, at least two, or in three independent or orthogonal directions.

Substrate 101 may comprise regions having a relatively high concentration of threading dislocations separated by regions having a relatively low concentration of threading dislocations. The concentration of threading dislocations in the relatively high concentration regions may be greater than about $10^5$ cm$^{-2}$, greater than about $10^6$ cm$^{-2}$, greater than about $10^7$ cm$^{-2}$, or greater than about $10^8$ cm$^{-2}$. The concentration of threading dislocations in the relatively low concentration regions may be less than about $10^6$ cm$^{-2}$, less than about $10^5$ cm$^{-2}$, or less than about $10^4$ cm$^{-2}$. Substrate 101 may comprise regions having a relatively high electrical conductivity separated by regions having a relatively low electrical conductivity. Substrate 101 may have a thickness between about 10 microns and about 100 millimeters, or between about 0.1 millimeter and about 10 millimeters. Substrate 101 may have a dimension, including a diameter, of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters.

Large-area surface 102 (FIG. 1A) may have a crystallographic orientation within about 5 degrees of the (000-1) N-face, c-plane orientation, may have an x-ray diffraction w-scan rocking curve full-width-at-half-maximum (FWHM) less than about 200 arcsec less than about 100 arcsec, less than about 50 arcsec, or less than about 30 arcsec for the (002) and/or the (102) reflections and may have a dislocation density less than about $10^7$ cm$^{-2}$, less than about $10^6$ cm$^{-2}$, or less than about $10^5$ cm$^{-2}$. In some embodiments, the threading dislocations in large-area surface 102 are approximately uniformly distributed. In other embodiments, the threading dislocations in large-area surface 102 are arranged inhomogeneously as a one-dimensional array of rows of relatively high- and relatively low-concentration regions or as a two-dimensional array of high-dislocation-density regions within a matrix of low-dislocation-density regions. The crystallographic orientation of large-area surface 102 may be constant to less than about 5 degrees, less than about 2 degrees, less than about 1 degree, less than about 0.5 degree, less than about 0.2 degree, less than about 0.1 degree, or less than about 0.05 degree. In certain embodiments, large-area surface 102 is roughened to enhance adhesion of a mask layer, for example, by wet-etching, to form a frosted morphology.

Referring again to FIG. 1A, a photoresist layer 103 may be deposited on the large-area surface 102 by methods that are known in the art. For example, in a certain embodiment of a lift-off process, a liquid solution of a negative photoresist is first applied to large-area surface 102. Substrate 101 is then spun at a high speed (for example, between 1000 to 6000 revolutions per minute for 30 to 60 seconds), resulting in a uniform photoresist layer 103 on large-area surface 102. Photoresist layer 103 may then be baked (for example, between about 90 and about 120 degrees Celsius) to remove excess photoresist solvent. After baking, the photoresist layer 103 may then be exposed to UV light through a photomask (not shown) to form a patterned photoresist layer 104 (FIG. 1B) having a pre-determined pattern of cross-linked photoresist, such as regions 104A, formed within the unexposed regions 104B. The regions 104B of the patterned photoresist may form stripes or dots having characteristic width or diameter W and pitch L. The patterned photoresist layer 104 may then be developed to remove non-cross linked material found in regions 104B and leave regions 104A, such as illustrated in FIG. 1C.

Referring to FIG. 1D, one or more mask layers 111 may be deposited on large-area surface 102 and regions 104A of the patterned photoresist layer 104. The one or more mask layers 111 may comprise an adhesion layer 105 that is deposited on the large-area surface 102, a diffusion-barrier layer 107 deposited over the adhesion layer 105, and an inert layer 109 deposited over the diffusion-barrier layer 107. The adhesion layer 105 may comprise one or more of Ti, TiN, TiN$_y$, TiSi$_2$, Ta, TaN$_y$, Al, Ge, Al$_x$Ge$_y$, Cu, Si, Cr, V, Ni, W, TiW$_x$, TiW$_x$N$_y$, or the like and may have a thickness between about 1 nanometer and about 1 micrometer. The diffusion-barrier layer 107 may comprise one or more of TiN, TiN$_y$, TiSi$_2$, W, TiW$_x$, TiN$_y$, WN$_y$, TaN$_y$, TiW$_x$N$_y$, TiW$_x$Si$_z$N$_y$, TiC, TiCN, Pd, Rh, Cr, or the like, and have a thickness between about 1 nanometer and about 10 micrometers. The inert layer 109 may comprise one or more of Au, Ag, Pt, Pd, Rh, Ru, Ir, Ni, Cr, V, Ti, or Ta and may have a thickness between about 10 nanometers and about 100 micrometers. The one or more mask layers 111 may be deposited by sputter deposition, thermal evaporation, electron-beam evaporation, or the like. After deposition of the patterned mask layer(s) 111, the portions of the mask layer(s) 111 residing above the regions 104A of the patterned photoresist layer 104 are not in direct contact with the substrate 101, as shown in FIG. 1D. The regions 104A and portions of the mask layer(s) 111 disposed thereon are then lifted off by methods that are known in the art to form the openings 112 in the mask layer(s) 111, as shown in FIG. 1E. In certain embodiments, a relatively thin inert layer, for example, 10 to 500 nanometers thick, is deposited prior to the lift-off process. After performing the lift-off process, an additional, thicker inert layer, for example, 5 to 100 micrometers thick, may be deposited over the already-patterned inert layer by electroplating, electroless deposition, or the like.

Other methods besides the lift-off procedure described above may be used to form the patterned mask layer 111, including shadow masking, positive resist reactive ion etching, wet chemical etching, ion milling, and nanoimprint lithography, plus variations of the negative resist lift-off procedure described above.

In certain embodiments, patterned mask layer(s) 111 are deposited on both the front and back surfaces of substrate 101.

Figure 1L:
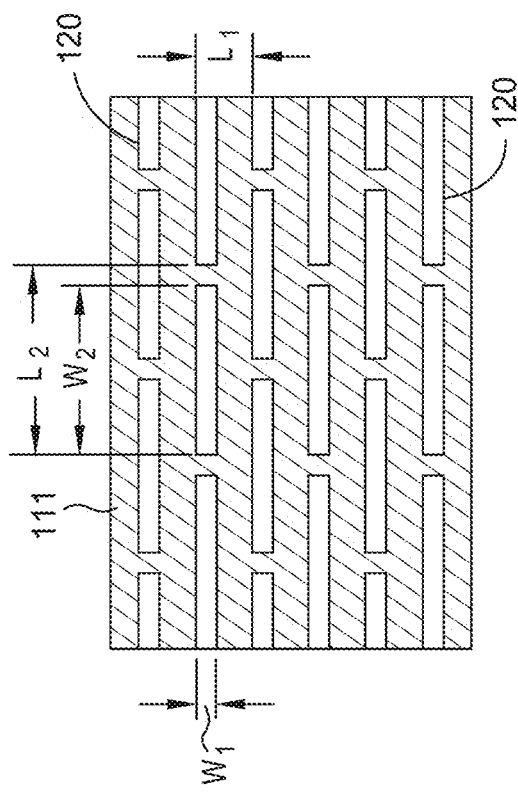

FIGS. 1F-1L are top views of arrangements of exposed regions 120 on the substrate 101 formed by one or more of the processes described above. The exposed regions 120 (or also referred to herein as growth centers), which are illustrated, for example, in FIGS. 1F-1L, may be defined by the openings 112 formed in patterned mask layer(s) 111 shown in FIG. 1E. In certain embodiments, the exposed regions 120 are arranged in a one-dimensional (1D) array in the y-direction, such as a single column of exposed regions 120 as shown in FIG. 1I. In certain embodiments, the exposed regions 120 are arranged in a two-dimensional (2D) array in x- and y-directions, such as illustrated in FIGS. 1F-1H and 1J-1L. The openings 112, and thus exposed regions 120, may be round, square, rectangular, triangular, hexagonal, or the like, and may have an opening dimension or diameter W between about 1 micrometer and about 5 millimeters, or between about 10 micrometers and about 500 micrometers such as illustrated in FIGS. 1F-1I. The exposed regions 120 may be arranged in a 2D hexagonal or square array with a pitch dimension L between about 5 micrometers and about 20 millimeters, between about 200 micrometers and about 15 millimeters, or between about 500 micrometers and about 10 millimeters, or between about 0.8 millimeter and about 5 millimeters, such as illustrated in FIGS. 1F and 1G. The exposed regions 120 may be arranged in a 2D array, in which the pitch dimension $L_1$ in the y-direction and pitch dimension $L_2$ in the x-direction may be different from one another, as illustrated in FIGS. 1H and 1J-1L. The exposed regions 120 may be arranged in a rectangular, parallelogram, hexagonal, or trapezoidal array (not shown), in which the pitch dimensions $L_1$ in the y-direction and $L_2$ in the x-direction may be different from one another, as illustrated in FIGS. 1H and 1J-1L). The array of exposed regions 120 may also be linear or irregular shaped. The exposed regions 120 in patterned mask layer(s) 111 may be placed in registry with the structure of substrate 101. For example, in certain embodiments, large-area surface 102 is hexagonal, e.g., a (0001) or (000-1) crystallographic orientation, and the openings in patterned mask layer(s) 111 comprise a 2D hexagonal array such that the separations between nearest-neighbor openings are parallel to <11-20> or <10-10> directions in large-area surface 102. In certain embodiments, large-area surface 102 of the substrate is nonpolar or semipolar and the exposed regions 120 comprise a 2D square or rectangular array such that the separations between nearest-neighbor openings are parallel to the projections of two of the c-axis, an m-axis, and an a-axis on large-area surface 102 of substrate 101. In certain embodiments, the pattern of exposed regions 120 is obliquely oriented with respect to the structure of substrate 101, for example, wherein the exposed regions 120 are rotated by between about 1 degree and about 44 degrees with respect to a high-symmetry axis of the substrate, such as a projection of the c-axis, an m-axis, or an a-axis on large-area surface 102 of substrate 101 that has a hexagonal crystal structure, such as a Wurtzite crystal structure. In certain embodiments, the exposed regions 120 are substantially linear rather than substantially round. In certain embodiments, the exposed regions 120 are slits having a width W and period L that run across the entire length of substrate 101, as illustrated in FIG. 1I. In certain embodiments, the exposed regions 120 are slits that have a width $W_1$ in the y-direction and a predetermined length $W_2$ in the x-direction that is less than the length of substrate 101 and may be arranged in a 2D linear array with period $L_1$ in the y-direction and period $L_2$ in the x-direction, as illustrated in FIGS. 1J-1L. In some embodiments, adjacent rows of exposed regions 120 (e.g., slits) may be offset in the x-direction from one another rather than arranged directly adjacent, as shown in FIG. 1K. In certain embodiments, the adjacent rows of exposed regions 120 (e.g., slits) may be offset in the longitudinal y-direction from one another. In certain embodiments, the exposed regions 120 include slits that extend in two or more different directions, for example, the x-direction and the y-direction, as shown in FIG. 1L. In certain embodiments, the exposed regions 120 (e.g., slits) may be arranged in a way that reflects the hexagonal symmetry of the substrate. In certain embodiments, the exposed regions 120 (e.g., slits) may extend to the edge of the substrate 101.

In an alternative embodiment, as shown in FIG. 1M, large-area surface 102 of substrate 101 is covered with a blanket mask 116, comprising one, two, or more of adhesion layer 105, diffusion-barrier layer 107, and inert layer 109, followed by a positive photoresist layer 113. The photoresist layer is exposed to UV light through a photomask (not shown), forming solubilizable, exposed regions 106B and unexposed regions 106A, as shown in FIG. 1N (essentially the negative of the pattern shown in FIG. 1B). Exposed regions 106B are then removed by developing. As shown in FIG. 1O, openings 112 in the blanket mask 116 (comprising adhesion layer 105, diffusion-barrier layer 107, and inert layer 109) may then be formed by wet or dry etching through the openings in patterned photoresist layer 113A, to form the patterned mask layer 111. After forming the openings 112 the photoresist layer 113 is removed, as shown in FIG. 1P, producing a structure that is similar or identical to that shown in FIG. 1E.

Trenches 115 are then formed in exposed regions 120 of the substrate 101 through the openings 112 (or "windows") formed in patterned mask layer 111, as shown in FIG. 1Q. In certain embodiments, the depth of the trenches 115 is between 50 micrometers and about 1 millimeter or between about 100 micrometers and about 300 micrometers. In certain embodiments the trenches 115 penetrate the entire thickness of substrate 101, forming patterned holes or slits that extend from the rear side 118 of the substrate 101 and through the openings 112 of the patterned mask layer 111. The width of an individual trench may be between about 10 micrometers and about 500 micrometers, or between about 20 micrometers and about 200 micrometers. Individual trenches 115 may be linear or curved and may have a length in the X-direction and/or Y-direction between about 100 micrometers and about 50 millimeters, or between about 200 micrometers and about 10 millimeters, or between about 500 micrometers and about 5 millimeters. In a specific embodiment, large-area surface 102 of substrate 101 has a (000-1), N-face orientation and trench 115 is formed by wet etching. In a specific embodiment, an etchant composition or solution comprises a solution of 85% phosphoric acid ($H_3PO_4$) and sulfuric ($H_2SO_4$) acids with a $H_2SO_4/H_3PO_4$ ratio between 0 and about 1:1. In certain embodiments, a phosphoric acid solution is conditioned to form polyphosphoric acid, increasing its boiling point. For example, reagent-grade (85%) $H_3PO_4$ may be conditioned by stirring and heating in a beaker at a temperature between about 200 degrees Celsius and about 450 degrees Celsius for between about 5 minutes and about five hours. In a specific embodiment, trench 115 is formed by heating masked substrate 101 in one of the aforementioned etch solutions at a temperature between about 200 degrees Celsius and about 350 degrees Celsius for a time between about 15 minutes and about 6 hours. In another embodiment, trench 115 is formed by electrochemical wet etching.

FIGS. 1R-1T show an alternative approach to forming an array of patterned, masked trenches in substrate 101. A blanket mask 116 (comprising adhesion layer 105, diffusion-barrier layer 107, and inert layer 109) may be deposited on large-area surface 102 of substrate 101 as shown in FIG. 1R. Nascent trenches 114 may be formed by laser ablation, as shown in FIG. 1S, to form a patterned mask layer 111. The laser ablation process is also known as or referred to as laser machining or laser beam machining processes. Laser ablation may be performed by a watt-level laser, such as a neodymium-doped yttrium-aluminum-garnet (Nd:YAG) laser, a $CO_2$ laser, an excimer laser, a Ti:sapphire laser, or the like. The laser may emit pulses with a pulse length in the nanosecond, picosecond, or femtosecond range. In certain embodiments the frequency of the output light of the laser may be doubled, tripled, or quadrupled using an appropriate nonlinear optic. The beam width, power, and scan rate of the laser over the surface of substrate 101 with patterned mask layer 111 may be varied to adjust the width, depth, and aspect ratio of nascent trenches 114. The laser may be scanned repetitively over a single trench or repetitively over the whole array of trenches.

The surfaces and sidewalls of the nascent trenches 114 may contain damage left over from the laser ablation process. In certain embodiments, substrate 101, containing nascent trenches 114, is further processed by wet etching, dry etching, or photoelectrochemical etching in order to remove residual damage in nascent trenches 114. In a specific embodiment, large-area surface 102 of substrate 101 has a (000-1), N-face orientation and a trench 115 is formed from nascent trench 114 by wet etching as shown in FIG. 1T. In a specific embodiment, an etchant composition or solution comprises a solution of 85% phosphoric acid ($H_3PO_4$) and sulfuric ($H_2SO_4$) acids with a $H_2SO_4/H_3PO_4$ ratio between 0 and about 1:1. In certain embodiments, a phosphoric acid solution is conditioned to form polyphosphoric acid, increasing its boiling point. For example, reagent-grade (85%) $H_3PO_4$ may be conditioned by stirring and heating in a beaker at a temperature between about 200 degrees Celsius and about 450 degrees Celsius for between about 5 minutes and about five hours. In a specific embodiment, trench 115 is formed by heating substrate 101 in one of the aforementioned etch solutions at a temperature between about 200 degrees Celsius and about 350 degrees Celsius for a time between about 15 minutes and about 6 hours.

The substrate 101 with the masked, patterned trenches 115 is then used as a substrate for bulk crystal growth, for example, comprising ammonothermal growth, HVPE growth, or flux growth. In the discussion below the grown GaN layer will be referred to as an ammonothermal layer, even though other bulk growth methods, such as HVPE or flux growth, may be used instead. In certain embodiments, comprising ammonothermal bulk growth, patterned substrate 101 may then be suspended on a seed rack and placed in a sealable container, such as a capsule, an autoclave, or a liner within an autoclave. In certain embodiments, one or more pairs of patterned substrates are suspended back to back, with the patterned large area surfaces facing outward. A group III metal source, such as polycrystalline group III metal nitride, at least one mineralizer composition, and ammonia (or other nitrogen containing solvent) are then added to the sealable container and the sealable container is sealed. The mineralizer composition may comprise an alkali metal such as Li, Na, K, Rb, or Cs, an alkaline earth metal, such as Mg, Ca, Sr, or Ba, or an alkali or alkaline earth hydride, amide, imide, amido-imide, nitride, or azide. The mineralizer may comprise an ammonium halide, such as $NH_4F$, $NH_4Cl$, $NH_4Br$, or $NH_4I$, a gallium halide, such as $GaF_3$, $GaCl_3$, $GaBr_3$, $GaI_3$, or any compound that may be formed by reaction of one or more of F, Cl, Br, I, HF, HCl, HBr, HI, Ga, GaN, and $NH_3$. The mineralizer may comprise other alkali, alkaline earth, or ammonium salts, other halides, urea, sulfur or a sulfide salt, or phosphorus or a phosphorus-containing salt. The sealable container (e.g., capsule) may then be placed in a high pressure apparatus, such as an internally heated high pressure apparatus or an autoclave, and the high pressure apparatus sealed. The sealable container, containing patterned substrate 101, is then heated to a temperature above about 400 degrees Celsius and pressurized above about 50 megapascal to perform ammonothermal crystal growth.

As a point of reference, FIGS. 2A-2C illustrate bulk crystal growth by a conventional LEO process with no trenches below mask openings. During a bulk crystal growth process, group III metal nitride layer 213 grows through the openings 112 of patterned mask layer 111, grows outward through the openings, as shown in FIG. 2B, grows laterally over patterned mask layer 111, and coalesces, as shown in FIG. 2C. After coalescence, group III metal nitride layer 213 comprises window regions 215, which have grown vertically with respect to the openings in patterned mask layer 111, wing regions 217, which have grown laterally over patterned mask layer 111, and coalescence fronts 219, which form at the boundaries between wings growing from adjacent openings in patterned mask layer 111. Threading dislocations 214 may be present in window regions 215, originating from threading dislocations that were present at the surface of the substrate 101.

FIGS. 3A-3C illustrate a bulk group III nitride sidewall LEO process. FIG. 3A illustrates a substrate that includes a patterned, masked trench 115, formed by one of the processes described herein. In a sidewall LEO process, a group III metal nitride material 221 grows on the sides and bottoms of the patterned, masked trenches 115 as shown in FIG. 3B. As group III metal nitride material 221 on the sidewalls of trenches 115 grow inward, it becomes progressively more difficult for group III nitride nutrient material to reach the bottom of the trenches, whether the nutrient material comprises an ammonothermal complex of a group III metal (in the case of ammonothermal growth), a group III metal halide (in the case of HVPE), or a group III metal alloy or inorganic complex (in the case of flux growth). Eventually group III metal nitride material 221 pinches off the lower regions of the trenches, forming voids 225 as shown in FIG. 3C. It has been found that the concentration of threading dislocations in group III metal nitride material 221, which has grown laterally, is lower than that in substrate 101. Many threading dislocations 223, originating from substrate 101, terminate on the surfaces of voids 225. Concomitantly, the group III metal nitride layer 213 grows upward through openings 112 (or windows) in patterned mask layer 111. However, since laterally-grown group III metal nitride material 221 has a lower concentration of threading dislocations than substrate 101 and many dislocations from substrate 101 have terminated at surfaces of voids 225, the dislocation density in the vertically grown group III metal nitride layer 213 is considerably reduced, relative to a conventional LEO process, as described above in conjunction with FIG. 2A-2C.

FIGS. 3D-3F illustrate the continuation of the sidewall LEO growth process. As in the conventional LEO process (FIGS. 2A-2C), group III metal nitride layer 213 grows within the openings 112 of patterned mask layer 111, grows outward through the openings as shown in FIG. 3D, grows laterally over patterned mask layer 111, and coalesces, as shown in FIG. 3E. After coalescence, group III metal nitride layer 213 comprises window regions 215, which have grown vertically with respect to the openings in patterned mask layer 111, wing regions 217, which have grown laterally over patterned mask layer 111, and coalescence fronts 219, which form at the boundaries between wings growing from adjacent openings in patterned mask layer 111, as shown in FIG. 3F. Since laterally-grown group III metal nitride material 221 has a lower concentration of threading dislocations than substrate 101 and many threading dislocations from substrate 101 have terminated in voids 225, the concentration of threading dislocations in window regions 215 is significantly lower than in the case of conventional LEO.

Ammonothermal group III metal nitride layer 213 may have a thickness between about 10 micrometers and about 100 millimeters, or between about 100 micrometers and about 20 millimeters.

In certain embodiments, ammonothermal group III metal nitride layer 213 is subjected to one or more processes, such as at least one of sawing, lapping, grinding, polishing, chemical-mechanical polishing, or etching.

In certain embodiments, the concentration of extended defects, such as threading dislocations and stacking faults, in the ammonothermal group III metal nitride layer 213 may be quantified by defect selective etching. Defect-selective etching may be performed, for example, using a solution comprising one or more of $H_3PO_4$, $H_3PO_4$ that has been conditioned by prolonged heat treatment to form polyphosphoric acid, and $H_2SO_4$, or a molten flux comprising one or more of NaOH and KOH. Defect-selective etching may be performed at a temperature between about 100 degrees Celsius and about 500 degrees Celsius for a time between about 5 minutes and about 5 hours, wherein the processing temperature and time are selected so as to cause formation of etch pits with diameters between about 1 micrometer and about 25 micrometers, then removing the ammonothermal group III metal nitride layer, crystal, or wafer from the etchant solution.

The concentration of threading dislocations in the surface of the window regions 215 may be less than that in the underlying substrate 101 by a factor between about 10 and about $10^4$. The concentration of threading dislocations in the surface of the window regions 215 may be less than about $10^8$ cm$^{-2}$, less than about $10^7$ cm$^{-2}$, less than about $10^6$ cm$^{-2}$, less than about $10^5$ cm$^{-2}$, or less than about $10^4$ cm$^{-2}$. The concentration of threading dislocations in the surface of wing regions 217 may be lower, by about one to about three orders of magnitude, than the concentration of threading dislocations in the surface of the window regions 215, and may be below about $10^5$ cm$^{-2}$, below about $10^4$ cm$^{-2}$, below about $10^3$ cm$^{-2}$, below about $10^2$ cm$^{-2}$, or below about 10 cm$^{-2}$. Some stacking faults, for example, at a concentration between about 1 cm$^{-1}$ and about $10^4$ cm$^{-1}$, may be present at the surface of the window regions 215. The concentration of stacking faults in the surface of wing regions 217 may be lower, by about one to about three orders of magnitude, than the concentration of stacking faults in the surface of the window regions 215, and may be below about $10^2$ cm$^{-1}$, below about 10 cm$^{-1}$, below about 1 cm$^{-1}$, or below about 0.1 cm$^{-1}$, or may be undetectable. Threading dislocations, for example, edge dislocations, may be present at coalescence fronts 219, for example, with a line density that is less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than $1\times10^2$ cm$^{-1}$. The density of dislocations along the coalescence fronts may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

In certain embodiments, the process of masking and bulk group III nitride crystal growth is repeated one, two, three, or more times. In some embodiments, these operations are performed while the first bulk group III metal nitride layer remains coupled to substrate 101. In other embodiments, substrate 101 is removed prior to a subsequent masking and bulk crystal growth operation, for example, by sawing, lapping, grinding, and/or etching.

FIGS. 4A and 4B are simplified diagrams illustrating a method of forming a free-standing group III metal nitride boule and free-standing group III metal nitride wafers. In certain embodiments, substrate 101 is removed from ammonothermal group III metal nitride layer 213 (FIG. 3F), or the last such layer deposited, to form free-standing ammonothermal group III metal nitride boule 413. Removal of substrate 101 may be accomplished by one or more of sawing, grinding, lapping, polishing, laser lift-off, self-separation, and etching to form a processed free-standing laterally-grown group III metal nitride boule 413. The processed free-standing laterally-grown group III metal nitride boule 413 may include a similar or essentially identical composition as the ammonothermal group III metal nitride layer and etching may be performed under conditions where the etch rate of the back side of substrate 101 is much faster than the etch rate of the front surface of the ammonothermal group III metal nitride layer. In certain embodiments a portion of ammonothermal group III metal nitride layer 213, or the last such layer deposited, may be protected from attack by the etchant by deposition of a mask layer, wrapping the portion of the layer with Teflon, clamping the portion of the layer against Teflon, painting with Teflon paint, or the like. In a specific embodiment, substrate 101 comprises single crystal gallium nitride, large-area surface 102 of substrate 101 has a crystallographic orientation within about 5 degrees of a (0001) crystallographic orientation, and substrate 101 is preferentially etched by heating in a solution comprising one or more of $H_3PO_4$, $H_3PO_4$ that has been conditioned by prolonged heat treatment to form polyphosphoric acid, and $H_2SO_4$ at a temperature between about 150 degrees Celsius and about 500 degrees Celsius for a time between about 30 minutes and about 5 hours, or by heating in a molten flux comprising one or more of NaOH and KOH. Surprisingly, patterned mask layer(s) 111 may facilitate preferential removal of substrate 101 by acting as an etch stop. The processed free-standing ammonothermal group III metal nitride boule 413 may include one or more window regions 415 that were formed above exposed regions 120, such as openings 112 in patterned mask layer(s) 111, on a substrate 101. The processed free-standing laterally-grown group III metal nitride boule 413 may also include one or more wing regions 417 that were formed above non-open regions in patterned mask layer(s) 111, and a pattern of locally-approximately-linear arrays 419 of threading dislocations, as shown in FIG. 4A. One or more of front surface 421 and back surface 423 of free-standing ammonothermal group III metal nitride boule 413 may be lapped, polished, etched, and chemical-mechanically polished. As similarly discussed above, the coalescence fronts 419 may include a coalescence front region that includes a "sharp boundary" that has a width less than about 25 micrometers or less than about 10 micrometers that is disposed between the adjacent wing regions 417, or an "extended boundary" that has a width between about 25 micrometers and about 1000 micrometers or between about 30 micrometers and about 250 micrometers that is disposed between the adjacent wing regions 417, depending on the growth conditions.

In certain embodiments, the edge of free-standing ammonothermal group III metal nitride boule 413 is ground to form a cylindrically-shaped ammonothermal group III metal nitride boule. In certain embodiments, one or more flats is ground into the side of free-standing ammonothermal group III metal nitride boule 413. In certain embodiments, free-standing ammonothermal group III metal nitride boule 413 is sliced into one or more free-standing ammonothermal group III metal nitride wafers 431, as shown in FIG. 4B. The slicing may be performed by multi-wire sawing, multi-wire slurry sawing, slicing, inner-diameter sawing, outer-diameter sawing, cleaving, ion implantation followed by exfoliation, laser cutting, or the like. One or more large-area surface of free-standing ammonothermal group III metal nitride wafers 431 may be lapped, polished, etched, electrochemically polished, photoelectrochemically polished, reactive-ion-etched, and/or chemical-mechanically polished according to methods that are known in the art. In certain embodiments, a chamfer, bevel, or rounded edge is ground into the edges of free-standing ammonothermal group III metal nitride wafers 431. The free-standing ammonothermal group III metal nitride wafers may have a diameter of at least about 5 millimeters, at least about 10 millimeters, at least about 25 millimeters, at least about 50 millimeters, at least about 75 millimeters, at least about 100 millimeters, at least about 150 millimeters, at least about 200 millimeters, at least about 300 millimeters, at least about 400 millimeters, or at least about 600 millimeters and may have a thickness between about 50 micrometers and about 10 millimeters or between about 150 micrometers and about 1 millimeter. One or more large-area surface of free-standing ammonothermal group III metal nitride wafers 431 may be used as a substrate for group III metal nitride growth by chemical vapor deposition, metalorganic chemical vapor deposition, hydride vapor phase epitaxy, molecular beam epitaxy, flux growth, solution growth, ammonothermal growth, among others, or the like.

FIGS. 5A-5E are simplified diagrams illustrating threading dislocation patterns formed in a free-standing group III metal nitride boule 413 or wafer 431. The large-area surfaces of the free-standing ammonothermal group III metal nitride boule 413 or wafers 431 may be characterized by a pattern of locally-approximately-linear arrays 419 of threading dislocations that propagated from coalescence fronts 219 formed during the epitaxial lateral overgrowth process, as discussed above in conjunction with FIGS. 3A-3F. The pattern of locally-approximately-linear arrays of threading dislocations may be 2D hexagonal, square, rectangular, trapezoidal, triangular, 1D linear, or an irregular pattern that is formed at least partially due to the pattern of the exposed regions 120 (FIGS. 1F-1L) used during the process to form free-standing laterally-grown group III metal nitride boule 413. One or more window regions 415 are formed above the exposed regions 120 (FIGS. 1F-1L), and one or more wing regions 417 are formed on portions that are not above the exposed regions 120, that is, were formed by lateral growth. As discussed above, the formed coalescence fronts 219 or 419 may include coalescence front regions that have a lateral width (i.e., measured parallel to the surface of the page containing FIGS. 5A-5E) that can vary depending on the growth conditions.

More complex patterns are also possible and may be advantageous, for example, in being more resistant to cracking or cleaving. The pattern 419 may be elongated in one direction compared to another orthogonal direction, for example, due to the free-standing laterally-grown group III metal nitride boule 413 being sliced at an inclined angle relative to the large-area surface of a free-standing ammonothermal group III metal nitride boule 413. The pattern 419 of locally-approximately-linear arrays of threading dislocations may be characterized by a linear array of threading dislocations (FIG. 5D) that have a pitch dimension L between about 5 micrometers and about 20 millimeters or between about 200 micrometers and about 5 millimeters. The pattern 419 of locally-approximately-linear arrays of threading dislocations may be characterized by a pitch dimension L (FIGS. 5A, 5B), or by pitch dimensions $L_1$ and $L_2$ in two orthogonal directions (FIGS. 5C and 5E), between about 5 micrometers and about 20 millimeters or between about 200 micrometers and about 5 millimeters, or between about 500 micrometers and about 2 millimeters. In certain embodiments, the pattern 419 of locally-approximately-linear arrays of threading dislocations is approximately aligned with the underlying crystal structure of the group III metal nitride, for example, with the locally-approximately-linear arrays lying within about 5 degrees, within about 2 degrees, or within about 1 degree of one or more of <1 0 −1 0>, <1 1 −2 0>, or [0 0 0 ±1] or their projections in the plane of the surface of the free-standing ammonothermal group III metal nitride boule 413 or wafer 431. The linear concentration of threading dislocations in the pattern may be less than about $1 \times 10^5$ cm$^{-1}$, less than about $3 \times 10^4$ cm$^{-1}$, less than about $1 \times 10^4$ cm$^{-1}$, less than about $3 \times 10^3$ cm$^{-1}$, less than about $1 \times 10^3$ cm$^{-1}$, less than about $3 \times 10^2$ cm$^{-1}$, or less than about $1 \times 10^2$ cm$^{-1}$. The linear concentration of threading dislocations in the pattern 419 may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

Referring again to FIGS. 5A-5E, the large-area surfaces of the free-standing ammonothermal group III metal nitride boule or wafer may further be characterized by an array of wing regions 417 and by an array of window regions 415. Each wing region 417 may be positioned between adjacent locally-approximately-linear arrays 419 of threading dislocations. Each window region 415 may be positioned within a single wing region 417 or may be positioned between two adjacent wing regions 417 and may have a minimum dimension between 10 micrometers and 500 micrometers and be characterized by concentration of threading dislocations between $10^3$ cm$^{-2}$ and $10^8$ cm$^{-2}$, resulting from residual threading dislocations that propagated vertically from window regions during the bulk crystal growth process, and by a concentration of stacking faults below $10^3$ cm$^{-1}$. In some embodiments the boundary between the window regions and the wing regions may be decorated with dislocations, for example, with a line density between about 5 cm$^{-1}$ and $10^5$ cm$^{-1}$.

The arrays may be elongated in one direction compared to another orthogonal direction, for example, due to the boule being sliced at an inclined angle relative to the large-area surface of a free-standing ammonothermal group III metal nitride boule. The pattern of locally-approximately-linear arrays 419 of threading dislocations may be characterized by a pitch dimension L, or by pitch dimensions $L_1$ and $L_2$ in two orthogonal directions, between about 5 micrometers and about 20 millimeters or between about 200 micrometers and about 5 millimeters. In certain embodiments, the pattern of locally-approximately-linear arrays 419 of threading dislocations is approximately aligned with the underlying crystal structure of the group III metal nitride, for example, with the locally-approximately-linear arrays lying within about 5 degrees, within about 2 degrees, or within about 1 degree of one or more of <1 0-1 0>, <1 1-2 0>, or [0 0 0±1] or their projections in the plane of the surface of the free-standing ammonothermal group III nitride boule or wafer. The linear concentration of threading dislocations in the pattern may be less than about $1\times10^5$ cm$^{-1}$, less than about $3\times10^4$ cm$^{-1}$, less than about $1\times10^4$ cm$^{-1}$, less than about $3\times10^3$ cm$^{-1}$, less than about $1\times10^3$ cm$^{-1}$, less than about $3\times10^2$ cm$^{-1}$, or less than about $1\times10^2$ cm$^{-1}$. The linear concentration of threading dislocations in the pattern may be greater than 5 cm$^{-1}$, greater than 10 cm$^{-1}$, greater than 20 cm$^{-1}$, greater than 50 cm$^{-1}$, greater than 100 cm$^{-1}$, greater than 200 cm$^{-1}$, or greater than 500 cm$^{-1}$.

The concentration of threading dislocations in the wing regions 417 between the locally-approximately-linear arrays of threading dislocations may be below about $10^5$ cm$^{-2}$, below about $10^4$ cm$^{-2}$, below about $10^3$ cm$^{-2}$, below about $10^2$ cm$^{-2}$, or below about 10 cm$^{-2}$. The concentration of threading dislocations in the surface of the window regions 415 may be less than about $10^8$ cm$^{-2}$, less than about $10^7$ cm$^{-2}$, less than about $10^6$ cm$^{-2}$, less than about $10^5$ cm$^{-2}$, or less than about $10^4$ cm$^{-2}$. The concentration of threading dislocations in the surface of the window regions may be higher than the concentration of threading dislocations in the surface of the wing regions by at least a factor of two, by at least a factor of three, by at least a factor of ten, by at least a factor of 30, or by at least a factor of 100. The concentration of threading dislocations in the surface of the window regions may be higher than concentration of threading dislocations in the surface of the wing regions by less than a factor of $10^4$, by less than a factor of 3000, by less than a factor of 1000, by less than a factor of 300, by less than a factor of 100, or by less than a factor of 30. In some embodiments the boundary between the window regions 415 and the wing regions 417 may be decorated with dislocations, for example, with a line density between about 5 cm$^{-1}$ and $10^5$ cm$^{-1}$. The concentration of threading dislocations, averaged over a large area surface of the free-standing ammonothermal group III nitride boule or wafer, may be below about $10^7$ cm$^{-2}$, below about $10^6$ cm$^{-2}$, below about $10^5$ cm$^{-2}$, below about $10^4$ cm$^{-2}$, below about $10^3$ cm$^{-2}$, or below about $10^2$ cm$^{-2}$. The concentration of stacking faults, averaged over a large area surface of the free-standing ammonothermal group III nitride boule or wafer, may be below about $10^3$ cm$^{-1}$, below about $10^2$ cm$^{-1}$, below about 10 cm$^{-1}$, below about 1 cm$^{-1}$, or below about 0.1 cm$^{-1}$, or may be undetectable. In some embodiments, for example, after repeated re-growth on a seed crystal with a patterned array of dislocations and/or growth to a thickness greater than 2 millimeters, greater than 3 millimeters, greater than 5 millimeters, or greater than 10 millimeters, the positions of the threading dislocations may be displaced laterally to some extent with respect to the pattern on the seed crystal. In such a case the regions with a higher concentration of threading dislocations may be somewhat more diffuse than the relatively sharp lines illustrated schematically in FIGS. 5A-5E. However, the concentration of threading dislocations as a function of lateral position along a line on the surface will vary periodically, with a period between about 5 micrometers and about 20 millimeters or between about 200 micrometers and about 5 millimeters. The concentration of threading dislocations within the periodically-varying region may vary by at least a factor of two, at least a factor of 5, at least a factor of 10, at least a factor of 30, at least a factor of 100, at least a factor of 300, or at least a factor of 1000.

The free-standing ammonothermal group III metal nitride boule or wafer may have a large-area crystallographic orientation within 5 degrees, within 2 degrees, within 1 degree, within 0.5 degree, within 0.2 degree, within 0.1 degree, within 0.05 degree, within 0.02 degree, or within 0.01 degree of (0001)+c-plane, (000-1)-c-plane, {10-10} m-plane, {1 1-2 0} a-plane, {11-2±2}, {60-6±1}, {50-5±1}, {40-4±1}, {30-3±1}, {50-5±2}, {70-7±3}, {20-2±1}, {30-3±2}, {40-4±3}, {50-5±4}, {10-1±1}, {1 0-1±2}, {1 0-1±3}, {2 1 -3±1}, or {3 0-3±4}. The free-standing ammonothermal group III metal nitride boule or wafer may have an (h k i l) semipolar large-area surface orientation, where i=-(h+k) and l and at least one of h and k are nonzero.

In certain embodiments, a large-area surface of a free-standing ammonothermal group III metal nitride crystal or wafer has a crystallographic orientation that is miscut from {10-10} m-plane by between about -60 degrees and about +60 degrees toward [0001]+c-direction and by up to about 10 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about -30 degrees and about +30 degrees toward [0001]+c-direction and by up to about 5 degrees toward an orthogonal <1-210> a-direction. In certain embodiments, a large-area surface of the free-standing ammonothermal group III metal nitride crystal or wafer has a crystallographic orientation that is miscut from {10-10} m-plane by between about -5 degrees and about +5 degrees toward [0001]+c-direction and by up to about 1 degree toward an orthogonal <1-210> a-direction. The free-standing ammonothermal group III metal nitride crystal or wafer may have a stacking fault concentration below $10^2$ cm$^{-1}$, below 10 cm$^{-1}$, or below 1 cm$^{-1}$, and a very low dislocation density, below about $10^5$ cm$^{-2}$, below about $10^4$ cm$^{-2}$, below about $10^3$ cm$^{-2}$, below about $10^2$ cm$^{-2}$, or below about 10 cm$^{-2}$ on one or both of the two large area surfaces.

The free-standing ammonothermal group III metal nitride boule or wafer may have a symmetric x-ray rocking curve full width at half maximum (FWHM) less than about 200 arcsec, less than about 100 arcsec, less than about 50 arcsec, less than about 35 arcsec, less than about 25 arcsec, or less than about 15 arcsec. The free-standing ammonothermal group III metal nitride boule or wafer may have a crystallographic radius of curvature greater than 0.1 meter, greater than 1 meter, greater than 10 meters, greater than 100 meters, or greater than 1000 meters, in at least one, at least two, or in three independent or orthogonal directions.

In certain embodiments, at least one surface of the free-standing ammonothermal group III metal nitride boule or wafer has atomic impurity concentrations of at least one of oxygen (O), and hydrogen (H) above about $1\times10^{16}$ $cm^{-3}$, above about $1\times10^{17}$ $cm^{-3}$, or above about $1\times10^{18}$ $cm^{-3}$. In certain embodiments, a ratio of the atomic impurity concentration of H to the atomic impurity concentration of O is between about 0.3 and about 1000, between about 0.4 and about 10, or between about 10 and about 100. In certain embodiments, at least one surface of the free-standing ammonothermal group III metal nitride boule or wafer has impurity concentrations of at least one of lithium (Li), sodium (Na), potassium (K), fluorine (F), chlorine (CI), bromine (Br), or iodine (I) above about $1\times10^{15}$ $cm^{-3}$, above about $1\times10^{16}$ $cm^{-3}$, or above about $1\times10^{17}$ $cm^{-3}$, above about $1\times10^{18}$ $cm^{-3}$. In certain embodiments, the top and bottom surfaces of the free-standing ammonothermal group III metal nitride boule or wafer may have impurity concentrations of O, H, carbon (C), Na, and K between about $1\times10^{16}$ $cm^{-3}$ and $1\times10^{19}$ $cm^{-3}$, between about $1\times10^{16}$ $cm^{-3}$ and $2\times10^{19}$ $cm^{-3}$, below $1\times10^{17}$ $cm^{-3}$, below $1\times10^{16}$ $cm^{-3}$, and below $1\times10^{16}$ $cm^{-3}$, respectively, as quantified by calibrated secondary ion mass spectrometry (SIMS). In another embodiment, the top and bottom surfaces of the free-standing ammonothermal group III metal nitride boule or wafer may have impurity concentrations of O, H, C, and at least one of Na and K between about $1\times10^{16}$ $cm^{-3}$ and $1\times10^{19}$ $cm^{-3}$, between about $1\times10^{16}$ $cm^{-3}$ and $2\times10^{19}$ $cm^{-3}$, below $1\times10^{17}$ $cm^{-3}$, and between about $3\times10^{15}$ $cm^{-3}$ and $1\times10^{18}$ $cm^{-3}$, respectively, as quantified by calibrated secondary ion mass spectrometry (SIMS). In still another embodiment, the top and bottom surfaces of the free-standing ammonothermal group III metal nitride boule or wafer may have impurity concentrations of O, H, C, and at least one of F and CI between about $1\times10^{16}$ $cm^{-3}$ and $1\times10^{19}$ $cm^{-3}$, between about $1\times10^{16}$ $cm^{-3}$ and $2\times10^{19}$ $cm^{-3}$, below $1\times10^{17}$ $cm^{-3}$, and between about $1\times10^{15}$ $cm^{-3}$ and $1\times10^{19}$ $cm^{-3}$, respectively, as quantified by calibrated secondary ion mass spectrometry (SIMS). In some embodiments, the top and bottom surfaces of the free-standing ammonothermal group III metal nitride boule or wafer may have impurity concentrations of H between about $5\times10^{17}$ $cm^{-3}$ and $1\times10^{19}$ $cm^{-3}$, as quantified by calibrated secondary ion mass spectrometry (SIMS). In certain embodiments, at least one surface of the free-standing ammonothermal group III metal nitride boule or wafer has an impurity concentration of copper (Cu), manganese (Mn), and iron (Fe) between about $1\times10^{16}$ $cm^{-3}$ and $1\times10^{19}$ $cm^{-3}$. In a specific embodiment, the free-standing ammonothermal group III metal nitride boule or wafer has an infrared absorption peak at about 3175 $cm^{-1}$, with an absorbance per unit thickness of greater than about 0.01 $cm^{-1}$.

The free-standing ammonothermal group III metal nitride crystal or wafer may be characterized by a wurtzite structure substantially free from any cubic entities or other crystal structures, the other structures being less than about 0.1% in volume in reference to the substantially wurtzite structure.

Surprisingly, given the lattice mismatch between HVPE GaN and ammonothermal GaN, results of use of the herein-disclosed techniques show that ammonothermal lateral epitaxial overgrowth is capable of producing thick, large-area GaN layers that are free of cracks. In certain embodiments, the free-standing ammonothermal group III metal nitride crystal or wafer has a diameter larger than about 25 millimeters, larger than about 50 millimeters, larger than about 75 millimeters, larger than about 100 millimeters, larger than about 150 millimeters, larger than about 200 millimeters, larger than about 300 millimeters, or larger than about 600 millimeters, and a thickness greater than about 0.1 millimeter, greater than about 0.2 millimeter, greater than about 0.3 millimeter, greater than about 0.5 millimeter, greater than about 1 millimeter, greater than about 2 millimeters, greater than about 3 millimeters, greater than about 5 millimeters, greater than about 10 millimeters, or greater than about 20 millimeters, and is substantially free of cracks. By contrast, we find that ammonothermal growth on large-area, un-patterned HVPE GaN seed crystals leads to cracking if the layers are thicker than a few hundred microns, even if a patterning process had been used to form the HVPE GaN seed crystal.

A free-standing ammonothermal group III metal nitride wafer may be characterized by a total thickness variation (TTV) of less than about 25 micrometers, less than about 10 micrometers, less than about 5 micrometers, less than about 2 micrometers, or less than about 1 micrometer, and by a macroscopic bow that is less than about 200 micrometers, less than about 100 micrometers, less than about 50 micrometers, less than about 25 micrometers, or less than about 10 micrometers. A large-area surface of the free-standing ammonothermal group III metal nitride wafer may have a concentration of macro defects, with a diameter or characteristic dimension greater than about 100 micrometers, of less than about 2 $cm^{-2}$, less than about 1 $cm^{-2}$, less than about 0.5 $cm^{-2}$, less than about 0.25 $cm^{-2}$, or less than about 0.1 $cm^{-2}$. The variation in miscut angle across a large-area surface of the free-standing ammonothermal group III metal nitride crystal or wafer may be less than about 5 degrees, less than about 2 degrees, less than about 1 degree, less than about 0.5 degree, less than about 0.2 degree, less than about 0.1 degree, less than about 0.05 degree, or less than about 0.025 degree in each of two orthogonal crystallographic directions. The root-mean-square surface roughness of a large-area surface of the free-standing ammonothermal group III metal nitride wafer, as measured over an area of at least 10 μm×10 μm, may be less than about 0.5 nanometer, less than about 0.2 nanometer, less than about 0.15 nanometer, less than about 0.1 nanometer, or less than about 0.10 nanometer. The free-standing ammonothermal group III metal nitride wafer may be characterized by n-type electrical conductivity, with a carrier concentration between about $1\times10^{17}$ $cm^{-3}$ and about $3\times10^{19}$ $cm^{-3}$ and a carrier mobility greater than about 100 $cm^2/V-s$. In alternative embodiments, the free-standing ammonothermal group III metal nitride wafer is characterized by p-type electrical conductivity, with a carrier concentration between about $1\times10^{15}$ $cm^{-3}$ and about $1\times10^{19}$ $cm^{-3}$. In still other embodiments, the free-standing ammonothermal group III metal nitride wafer is characterized by semi-insulating electrical behavior, with a room-temperature resistivity greater than about $10^7$ ohm-centimeter, greater than about $10^8$ ohm-centimeter, greater than about $10^9$ ohm-centimeter, greater than about $10^{10}$ ohm-centimeter, or greater than about $10^{11}$ ohm-centimeter. In certain embodiments, the free-standing ammonothermal group III metal nitride wafer is highly transparent, with an optical absorption coefficient at a wavelength of 400 nanometers that is less than about 10 $cm^{-1}$, less than about 5

$cm^{-1}$, less than about 2 $cm^{-1}$, less than about 1 $cm^{-1}$, less than about 0.5 $cm^{-1}$, less than about 0.2 $cm^{-1}$, or less than about 0.1 $cm^{-1}$.

In some embodiments, the free-standing ammonothermal group III metal nitride crystal or wafer is used as a seed crystal for further bulk growth. In one specific embodiment, the further bulk growth comprises ammonothermal bulk crystal growth. In another specific embodiment, the further bulk growth comprises high temperature solution crystal growth, also known as flux crystal growth. In yet another specific embodiment, the further bulk growth comprises HVPE. The further-grown crystal may be sliced, lapped, polished, etched, and/or chemically-mechanically polished into wafers by methods that are known in the art. The surface of the wafers may be characterized by a root-mean-square surface roughness measured over a 10-micrometer by 10-micrometer area that is less than about 1 nanometer or less than about 0.2 nanometers.

A wafer may be incorporated into a semiconductor structure. The semiconductor structure may comprise at least one $Al_xIn_yGa_{(1-x-y)}N$ epitaxial layer, where 0≤x, y, x+y≤1. The epitaxial layer may be deposited on the wafer, for example, by metalorganic chemical vapor deposition (MOCVD) or by molecular beam epitaxy (MBE), according to methods that are known in the art. At least a portion of the semiconductor structure may form a portion of a gallium-nitride-based electronic device or optoelectronic device, such as a light emitting diode, a laser diode, a photodetector, an avalanche photodiode, a photovoltaic, a solar cell, a cell for photoelectrochemical splitting of water, a transistor, a rectifier, and a thyristor; one of a transistor, a rectifier, a Schottky rectifier, a thyristor, a p-i-n diode, a metal-semiconductor-metal diode, high-electron mobility transistor, a metal semiconductor field effect transistor, a metal oxide field effect transistor, a power metal oxide semiconductor field effect transistor, a power metal insulator semiconductor field effect transistor, a bipolar junction transistor, a metal insulator field effect transistor, a heterojunction bipolar transistor, a power insulated gate bipolar transistor, a power vertical junction field effect transistor, a cascode switch, an inner sub-band emitter, a quantum well infrared photodetector, a quantum dot infrared photodetector, and combinations thereof. The gallium-nitride-based electronic device or optoelectronic device may be incorporated into a lamp or a fixture, such as a luminaire. The gallium-nitride-based electronic device or optoelectronic device, after singulation, may have lateral dimensions of at least 0.1 millimeter by 0.1 millimeter. The gallium-nitride-based electronic or optoelectronic device may have a maximum dimension of at least 8 millimeters and, for example, may comprise a laser diode. The gallium-nitride-based electronic or optoelectronic device may be entirely free of dislocations throughout its volume. For example, at a dislocation density of $10^4$ $cm^{-2}$, a substantial fraction of 0.1×0.1 $mm^2$ devices could be expected to be free of dislocations. At a dislocation density of $10^2$ $cm^{-2}$, a substantial fraction of 1×1 $mm^2$ devices could be expected to be free of dislocations. The gallium-nitride-based electronic or optoelectronic device may be entirely free of stacking faults throughout its volume. For example, at a stacking fault density of 1 $cm^{-1}$, a substantial fraction of 10×1 $mm^2$ stripe-shaped devices, such as laser diodes with nonpolar or semipolar large area surfaces and c-plane facets, could be expected to be free of stacking faults.

Figure 6A:
FIGS. 6A, 6B, 7A, and 7B are cross-sectional diagrams illustrating methods and resulting optical, opto-electronic, or electronic devices according to embodiments of the present disclosure.
Figure 6B:
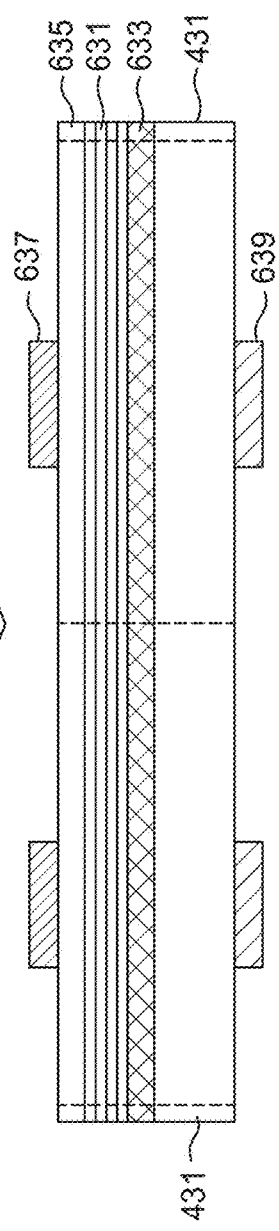

FIGS. 6A, 6B, 7A, and 7B are cross-sectional diagrams illustrating methods and resulting opto-electronic and electronic devices according to embodiments of the present disclosure. A two- or three-terminal device, such as an opto-electronic or electronic device, may be formed by a sequence of steps, including the step of epitaxial layer deposition atop a free-standing ammonothermal group III metal nitride wafer 431 or substrate having a pattern of locally-approximately-linear arrays 419 of threading dislocations and comprising at least one AlInGaN active layer 631, e.g., by MOCVD as shown in FIG. 6B. In certain embodiments, the deposited layers include an n-type or n+ layer 633, a doped or unintentionally doped single quantum well (SQW), a multiple quantum well (MQVV) structure or double-heterostructure (DH structure), or an n-drift layer, and a p-type layer 635, as shown. The device structures may be vertical, as illustrated schematically in FIG. 6B, or lateral, as illustrated schematically in FIG. 7A. The device may be electrically connected to an external circuit to provide a potential between an n-type contact 639 and a p-type contact 637. Additional layers may be deposited, such as separate confinement heterostructure (SCH) layers, cladding layers, an AlGaN electron-blocking layer, and a p+ contact layer, among others. In many cases, threading dislocations in the substrates, such as coalescence fronts 419, will propagate into the deposited layers and potentially impact device performance.

Figure 7A:
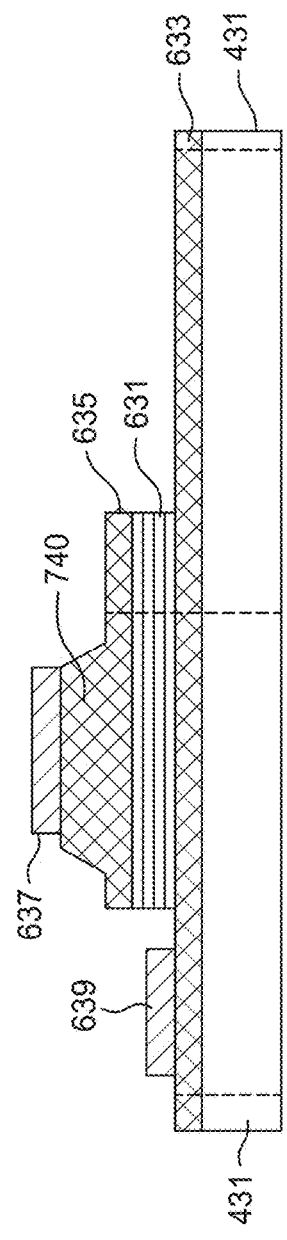

In a specific embodiment, the method also deposits an n-type contact 639, and a p-type contact 637 as shown in FIGS. 6B and 7A. In some embodiments, at least one of the set of n-type and p-type contacts is placed in specific registry respect to the coalescence fronts, wing regions, and/or window regions. A light emission portion may be centered over the coalescence front, or between coalescence fronts. In one specific embodiment, transparent p-type contacts are deposited and are placed in such a way that they avoid contact with coalescence fronts, which may have an elevated concentration of threading dislocations. In this way a light-emitting structure may be formed has a relatively low concentration of threading dislocations. In this way a light-emitting structure, PN diode, or Schottky barrier diode may be formed has a relatively low concentration of threading dislocations. In preferred embodiments, regions of light emission and/or maximum electric fields are designed to overlie wing regions 417 and to avoid coalescence front regions 419. In certain embodiments, a defective region associated with a coalescence front or a window region is utilized as a shunt path for reducing series resistance. In certain embodiments, n-type contacts are placed above coalescence fronts or window regions, with an edge dislocation density above $10^3$ $cm^{-1}$ and/or a threading dislocation density greater than about $10^5$ $cm^{-2}$.

Referring now to FIG. 7A, in some embodiments, e.g., a laser diode, a PN diode, or a Schottky barrier diode, the p-contact may be placed in a region substantially free of coalescence fronts. In certain embodiments, such as a laser diode, a laser ridge or stripe structure 740 may be placed in a region substantially free of coalescence fronts. A mesa may be formed by conventional lithography and an n-type contact placed in electrical contact with the n-type layer and/or the substrate. Additional structures may be placed in registry with the coalescence fronts, such as sidewall passivation, an ion implanted region, field plates, and the like.

Figure 7B:
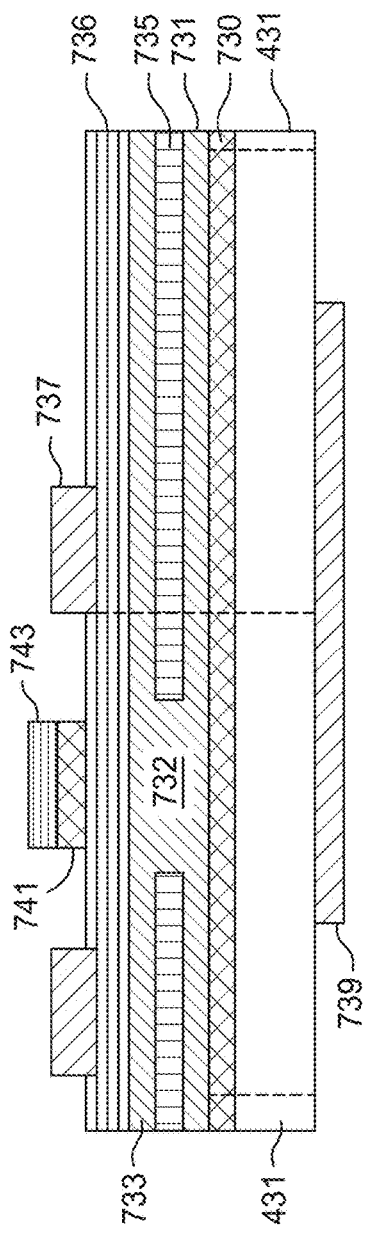

Referring now to FIG. 7B, in some embodiments, for example, a current aperture vertical electron transistor (CAVET), an n-drift layer 731 is deposited over an n+ contact layer 730, which in turn is deposited on free-standing, merged ammonothermal group III metal nitride wafer 431. P-type layer 735 is formed above n-drift layer 731 with aperture 732. Following regrowth of the balance of n-drift layer 733, an AlGaN 2D electron gas layer 736 is deposited. Finally, source contacts 737, drain contact 739, dielectric layer 741, and gate contact 743 are deposited. In preferred embodiments, aperture 732 is positioned away from coalescence fronts 419. In preferred embodiments, aperture 732 is positioned away from window regions 415. In preferred embodiments, aperture 732 is positioned over wing regions 417. Other types of three-terminal devices, such as trench CAVETs, MOSFETs, and the like are positioned so that the regions of maximum electric fields are located within wing regions 417.

Figure 8:
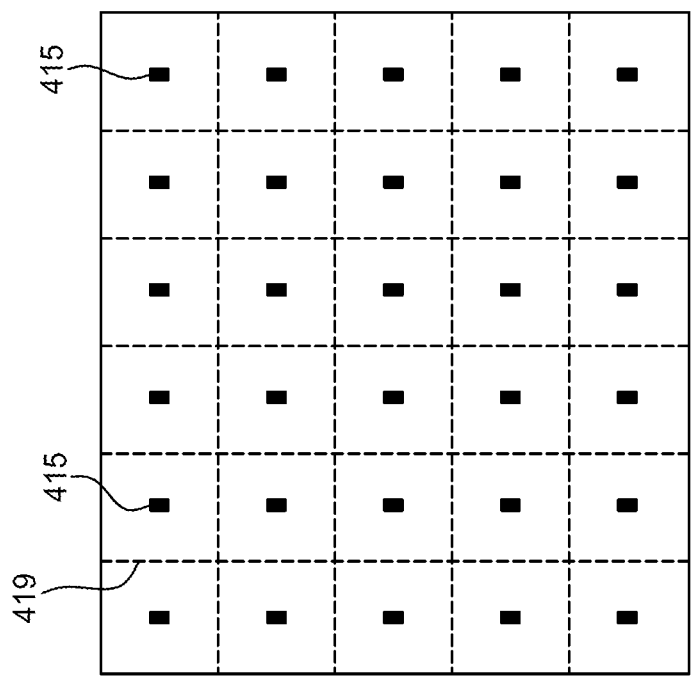
FIG. 8 is a top view (plan view) of a free-standing laterally-grown GaN boule or wafer formed by ammonothermal lateral epitaxial growth using a mask layer having openings arranged in a two-dimensional square array.

FIG. 8 shows a top view (plan view) of a free-standing GaN substrate formed by ammonothermal lateral epitaxial growth using a mask in the form of a two-dimensional array. The GaN layer grew through the two-dimensional array of openings in the original mask layer to form window regions 415. Coalescence of the GaN layer may form a two-dimensional grid of the pattern of locally-approximately-linear arrays 419 of threading dislocations.

Figure 9A:
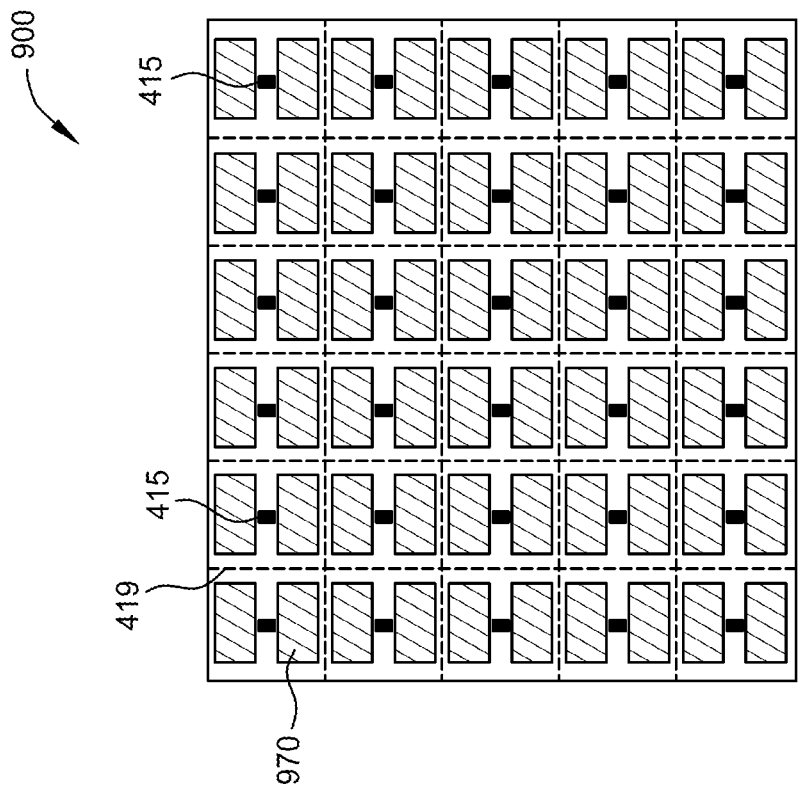
FIGS. 9A, 9B, and 9C are top views of a device structure, for example, of LEDs, according to embodiments of the present disclosure.
Figure 9C:
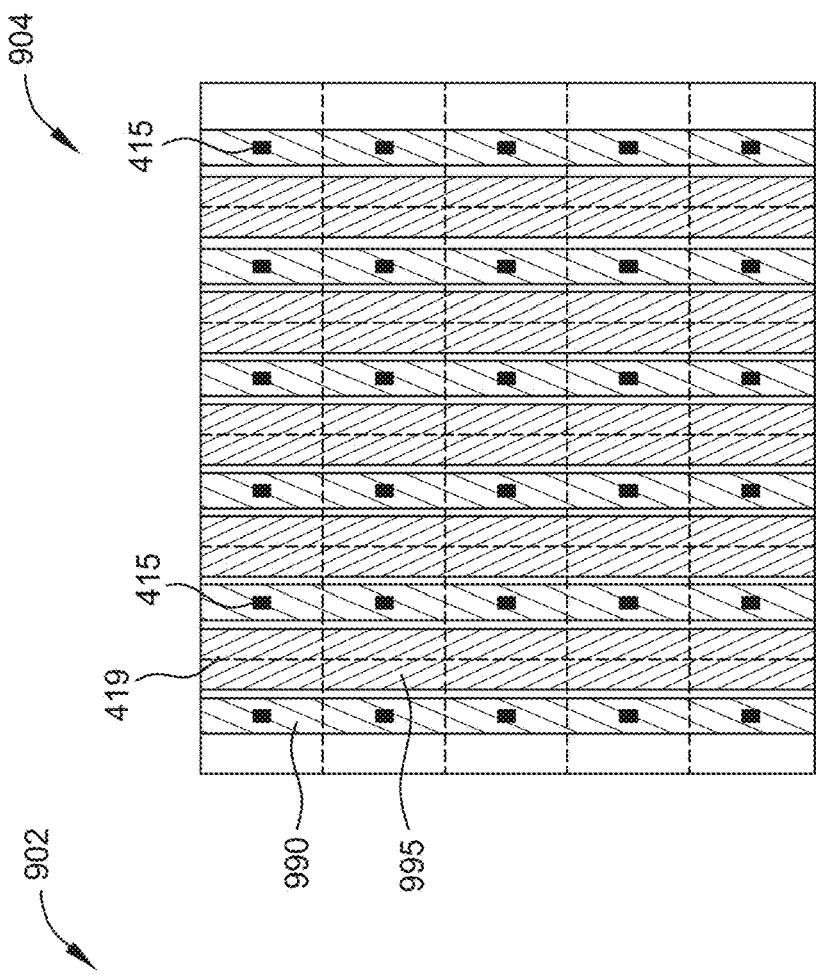
Figure 9B:
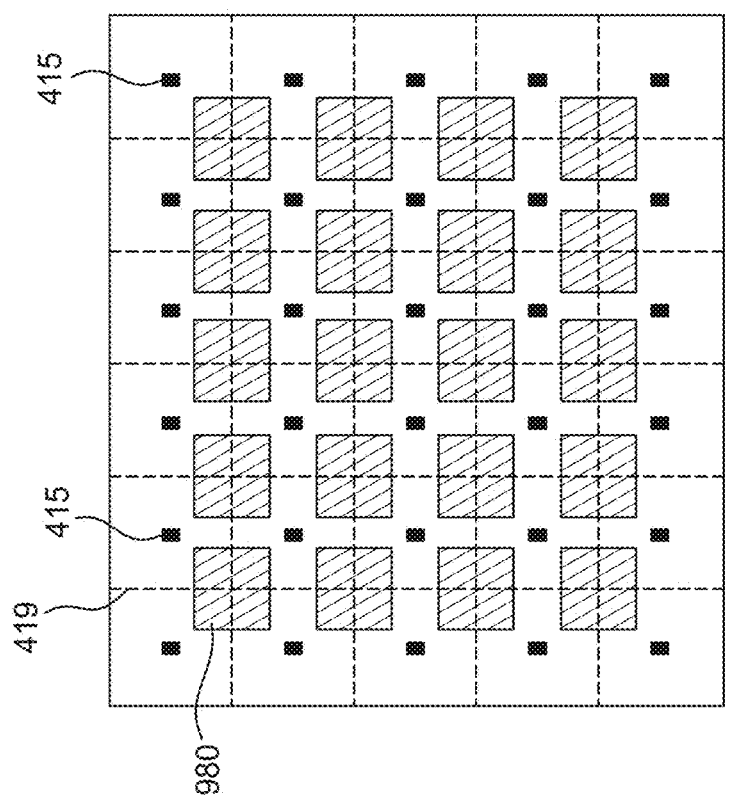

FIG. 9A shows a top view of a device structure 900, for example, of LEDs, where transparent p-contacts 970 have been aligned with respect and placed so as not to be in contact with either the window regions 415 or the pattern of locally-approximately-linear arrays 419 of threading dislocations. FIG. 9B shows a top view of an alternative embodiment of a device structure 902, for example, of LEDs, where electrical contacts 980 are again aligned with respect to window regions 415 and pattern of locally-approximately-linear arrays 419 of threading dislocations but now are positioned above pattern of locally-approximately-linear arrays 419 of threading dislocations. FIG. 9C shows a top view of an alternative embodiment of a device structure 904, for example, of a flip-chip LED, where n-type electrical contacts 990 are aligned with respect to window regions 415 and p-type electrical contacts 995 are aligned between window regions 415.

Individual die, for example, light emitting diodes or laser diodes, may be formed by sawing, cleaving, slicing, singulating, or the like, between adjacent sets of electrical contacts. Referring again to FIG. 9A, slicing may be performed along the pattern of locally-approximately-linear arrays 419 of threading dislocations. Slicing may also be performed through window regions 415. Referring now to FIG. 9B, in certain embodiments, slicing may be performed through window regions 415 but not along the pattern of locally-approximately-linear arrays 419 of threading dislocations. Referring again to FIG. 9C, in certain embodiments slicing is performed neither through the seed regions nor along all coalescence fronts. Depending on the arrangement of the one- or two-dimensional array of seed regions, the singulated die may have three corners, four corners, or six corners.

The methods described herein provide means for fabricating large-area group III metal nitride substrates, albeit having some potentially defective regions. The methods described herein provide means for fabricating high-performance light emitting diodes and/or laser diodes that avoid potential issues associated with defective regions in the large-area group III metal nitride substrates.

The above sequence of steps provides a method according to an embodiment of the present disclosure. In a specific embodiment, the present disclosure provides a method and resulting crystalline material provided by a high pressure apparatus having structured support members. Other alternatives can also be provided where steps are added, one or more steps are removed, or one or more steps are provided in a different sequence without departing from the scope of the claims herein.

EXAMPLES

Embodiments provided by the present disclosure are further illustrated by reference to the following examples. It will be apparent to those skilled in the art that many modifications, both to materials, and methods, may be practiced without departing from the scope of the disclosure.

Example 1

Figure 10:
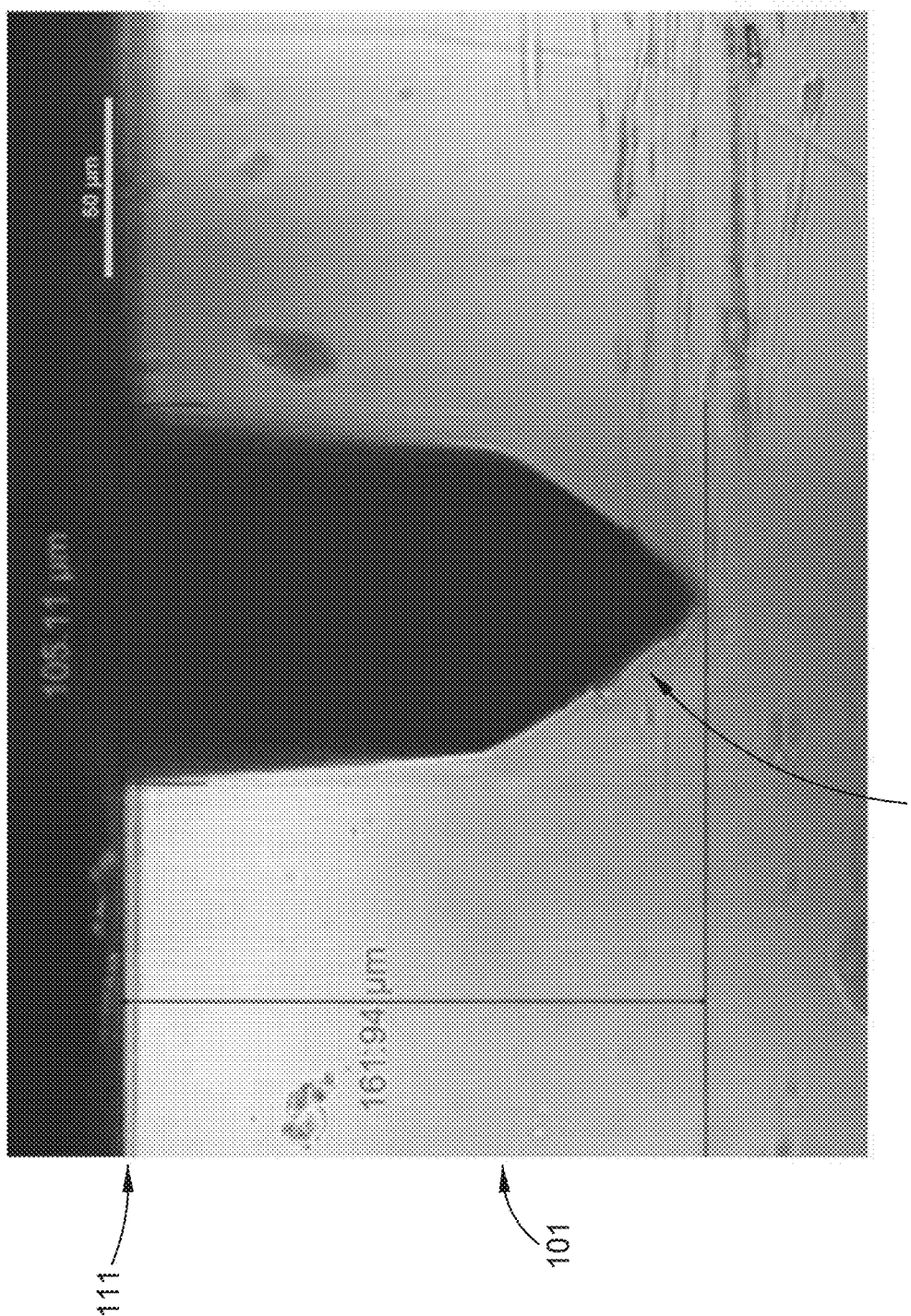
FIG. 10 is an optical micrograph of a polished cross section of a trench in a c-plane GaN substrate that has been prepared according to an embodiment of the present disclosure.

A c-plane oriented bulk GaN crystal grown by HVPE, approximately 0.3 millimeters thick, was provided for use as a substrate 101 for patterning and ammonothermal crystal growth. A 100-nanometer-thick layer of TiW was sputter-deposited as an adhesion layer on the (000-1) N-face of the substrate, followed by a 780-nanometer-thick inert layer comprising Au. A 6-micrometer-thick Au layer was then electroplated on the sputtered layer, increasing the thickness of the inert layer (e.g., blanket mask 116). Using AZ-4300 as a photoresist (e.g., photoresist layer 103), a pattern comprising linear arrays of 3-micrometer-wide by 1-centimeter-long slits (e.g., openings 112), with a pitch diameter of 1200 micrometers was defined. A wet-etch process was performed, using a commercial TFA gold etching solution at room temperature, as shown schematically in FIGS. 1M-1P, to obtain a substrate with patterned mask layer 111. The mask pattern comprised domains of m-stripes, with linear openings oriented approximately 30-40 micrometers wide and parallel to <10-10>. The substrate with patterned mask layer 111 was then placed in a stirred beaker with concentrated $H_3PO_4$. The beaker was heated to approximately 280 degrees Celsius over approximately 30 minutes, held at this temperature for approximately 90 minutes, and cooled. A cross section of a trench 115 formed by this procedure, having a depth of approximately 162 micrometers and a width at the top of approximately 105 micrometers, is shown in FIG. 10. The sidewalls of the trench 115, remarkably, are nearly vertical.

Example 2

Figure 11B:
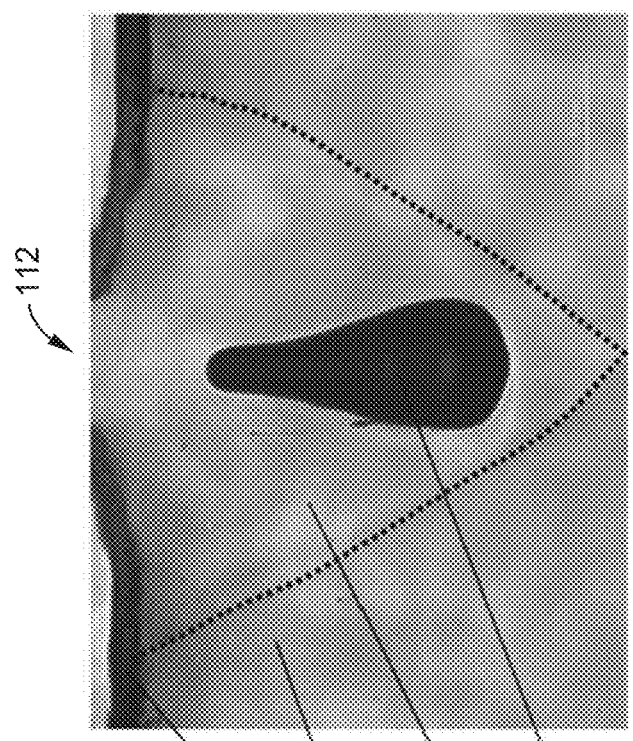
FIGS. 11A and 11B are optical micrographs of a cross section of a c-plane ammonothermal GaN layer that has formed according to an embodiment of the present disclosure, together with a close-up image from the same cross section.
Figure 11A:
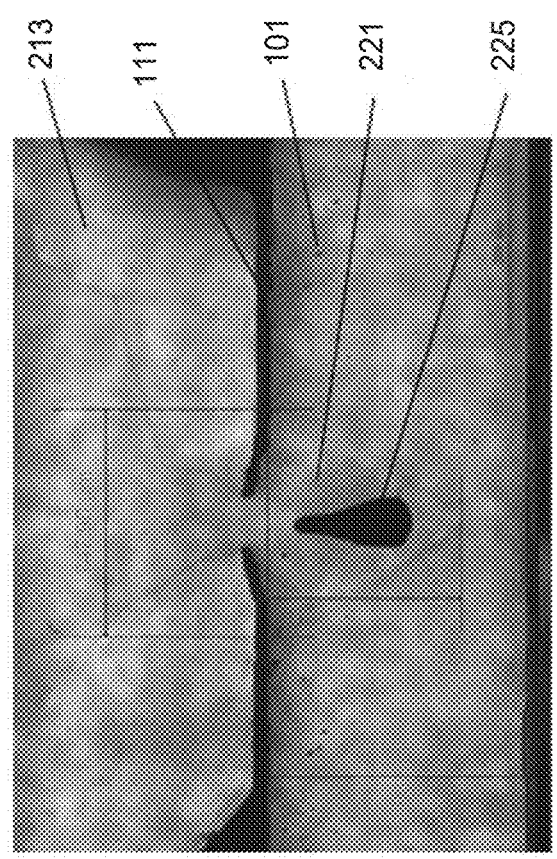

A patterned, trenched c-plane-oriented bulk GaN substrate 101 was prepared by a similar procedure as that described in Example 1. The patterned substrate was placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 1.69 and 0.099 respectively, by weight. The capsule was placed in an internally-heated high pressure apparatus and heated to temperatures of approximately 666 degrees Celsius for the upper, nutrient zone and approximately 681 degrees Celsius for the lower, crystal growth zone, maintained at these temperatures for approximately 215 hours, and then cooled and removed. Ammonothermal GaN filled in most of the volume in the trenches, grew through the linear openings in the patterned mask on the HVPE GaN substrate, grew laterally, and coalesced fully, forming an ammonothermal GaN layer approximately 1200 micrometers thick with a smooth top surface. Two parallel cuts were made in the ammonothermal GaN layer, perpendicular to both the surface and the patterns, resulting in a bar-shaped test specimen with m-plane surfaces. One m-plane surface of the test specimen was polished and examined by optical microscopy, as shown in FIGS. 11A and 11B. An interface is visible between the substrate 101 and laterally-grown group III metal nitride material 221, as illustrated by the dotted line in the expanded view on the right side of FIG. 11B. Patterned mask layer 111 and void 225 both appear as black in the images and underlie ammonothermal group III metal nitride layer 213.

Example 3

Figure 12B:
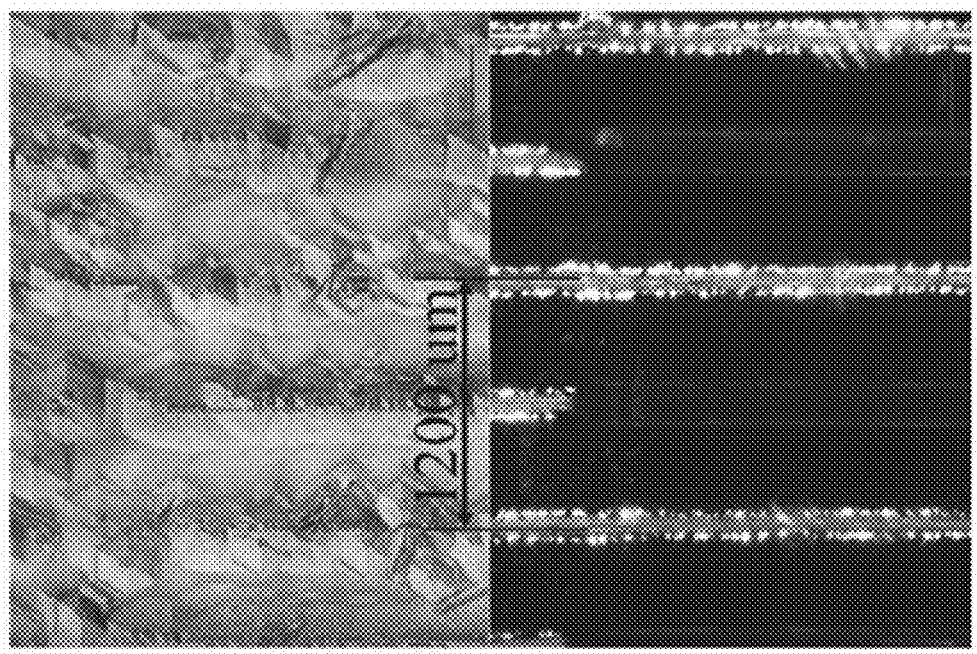
FIGS. 12A and 12B are plan-view optical micrographs of c-plane ammonothermal GaN layers that have been subjected to defect-selective etching, showing a low concentration of etch pits in the window region above slit-shaped mask openings oriented along a <10-10> direction and a linear array of etch pits (threading dislocations) at coalescence fronts formed approximately midway between two window regions, according to two embodiments of the present disclosure.
Figure 12A:
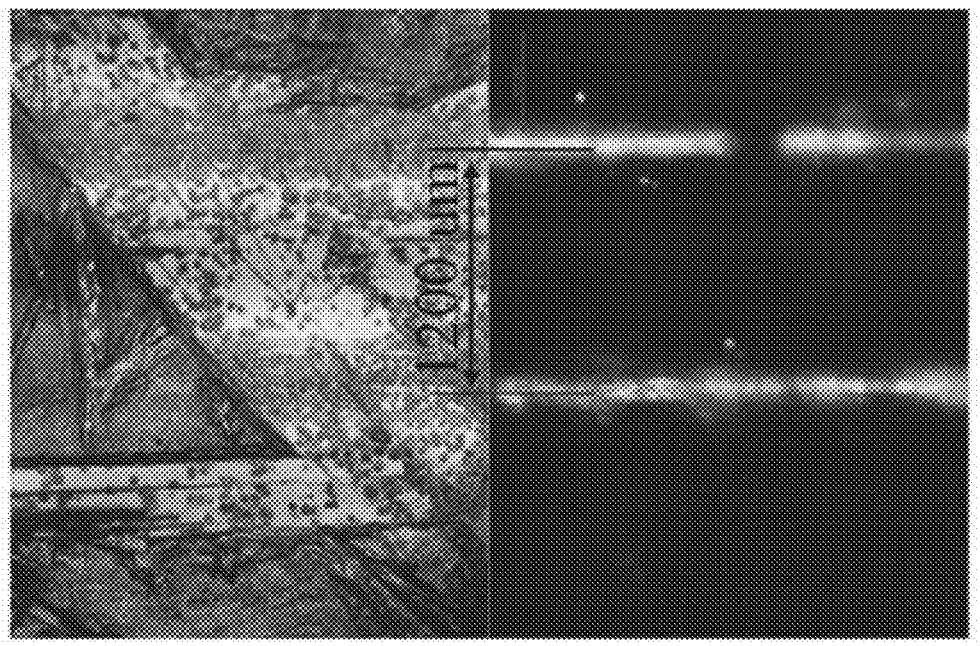

A patterned, trenched c-plane-oriented bulk GaN substrate was prepared by a similar procedure as that described in Examples 1 and 2, and the final group III metal nitride layer 213 is shown in FIG. 12B (i.e., right side figures). A second patterned substrate was prepared by a similar procedure except that no trenches were prepared below the mask openings, and the final group III metal nitride layer is shown in FIG. 12A (i.e., left side figures). The patterned substrates were placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 2.05 and 0.099 respectively, by weight. The capsule was placed in an internally-heated high pressure apparatus and heated to temperatures of approximately 666 degrees Celsius for the upper, nutrient zone and approximately 678 degrees Celsius for the lower, crystal growth zone, maintained at these temperatures for approximately 427 hours, and then cooled and removed. Ammonothermal GaN filled in most of the volume in the trenches of the trenched substrate (FIG. 12B), grew through the linear openings in the patterned mask on the HVPE GaN substrate, grew laterally, and coalesced fully, forming an ammonothermal GaN layer approximately 2100 micrometers thick with a smooth top surface. Ammonothermal GaN layer similarly grew through the linear openings in the patterned mask on the patterned, untrenched HVPE GaN substrate (FIG. 12A), grew laterally, and coalesced fully, forming an ammonothermal GaN layer approximately 2100 micrometers thick with a smooth top surface. The surface of both ammonothermal GaN layers were lightly etched and were examined by optical microscopy. Differential interference contrast (Nomaraki) micrographs and transmission micrographs of both layers are shown in FIGS. 12A-12B. The average etch pit density, which is believed to accurately represent the threading dislocation density, of the ammonothermal GaN layer grown on the patterned substrate without trenches (FIG. 12A), was approximately $1.0 \times 10^5$ $cm^{-2}$. The average etch pit density of the ammonothermal GaN layer grown on the patterned, trenched substrate (FIG. 12B), was approximately $1.0 \times 10^4$ $cm^{-2}$, a full order-of-magnitude improvement.

Example 4

Figure 13:
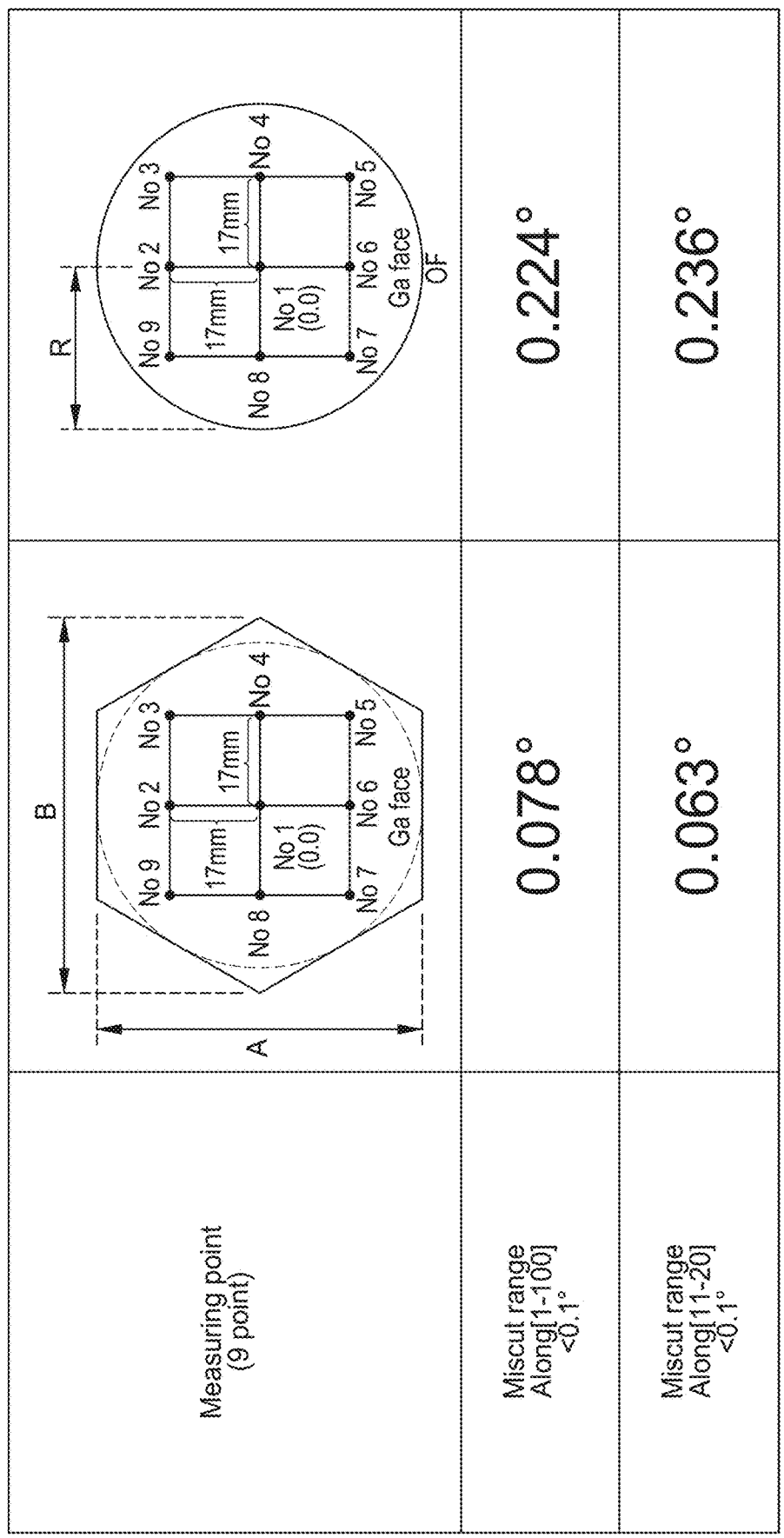
FIG. 13 is a summary of x-ray diffraction measurements comparing the miscut variation across a 50 mm wafer fabricated according to one embodiment of the present disclosure with that of a commercially-available 50 mm wafer.
Figure 14:
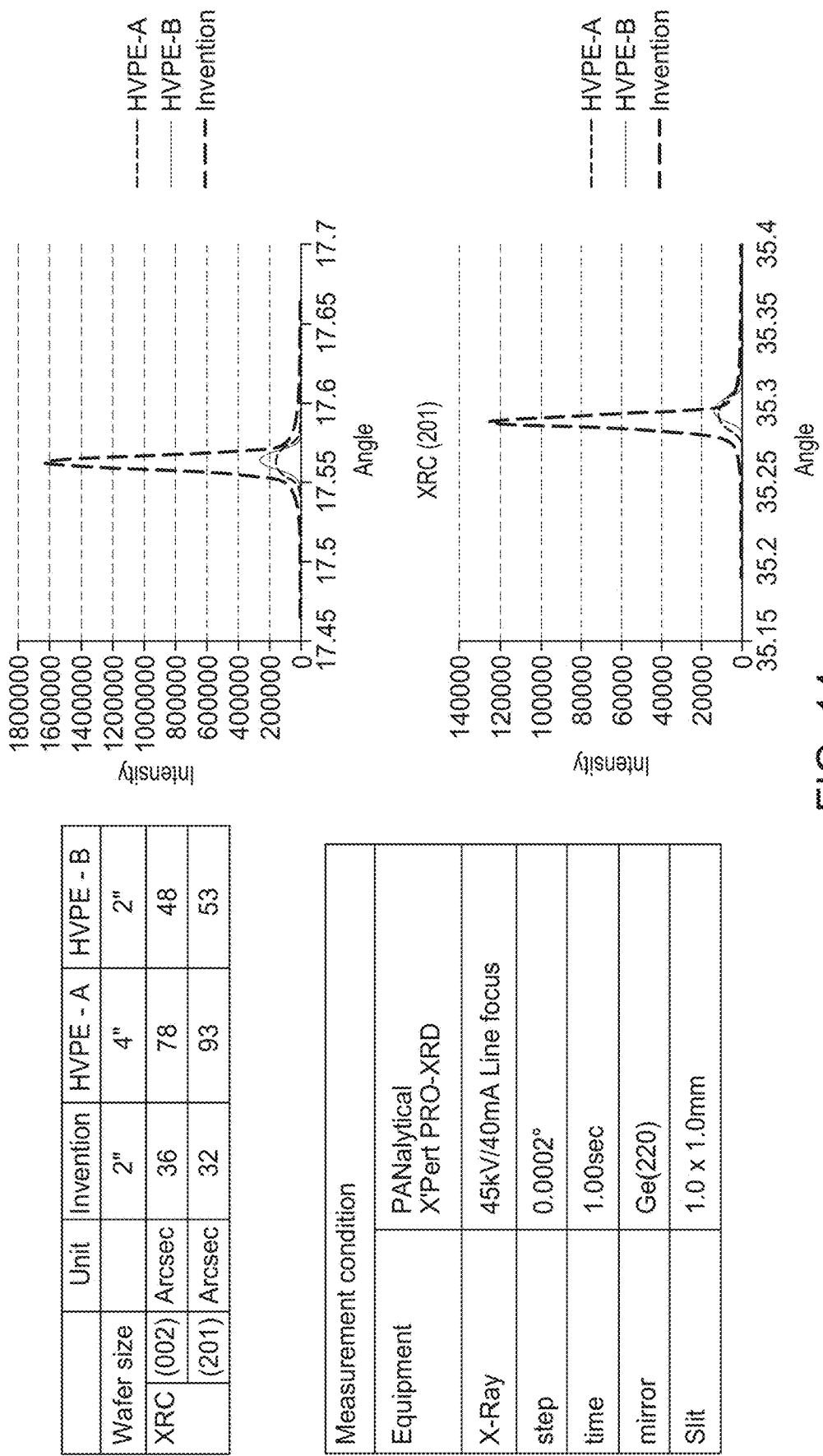
FIG. 14 is a summary of x-ray rocking-curve measurements comparing the full-width-at-half-maximum values of two reflections from a 50 mm wafer fabricated according to one embodiment of the present disclosure with that of a commercially-available 50 mm wafer.

A patterned, trenched c-plane-oriented bulk GaN substrate was prepared by a similar procedure as that described in Examples 1 and 2 but with a pitch of 800 micrometers. The patterned, trenched substrate was placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 1.71 and 0.099 respectively, by weight. The capsule was placed in an internally-heated high pressure apparatus and heated to temperatures of approximately 668 degrees Celsius for the upper, nutrient zone and approximately 678 degrees Celsius for the lower, crystal growth zone, maintained at these temperatures for approximately 485 hours, and then cooled and removed. Ammonothermal GaN filled in most of the volume in the trenches of the trenched substrate, grew through the linear openings in the patterned mask on the HVPE GaN substrate, grew laterally, and coalesced fully, forming an ammonothermal GaN layer approximately 980 micrometers thick with a smooth top surface. The HVPE GaN substrate was removed by grinding, and the resulting free-standing ammonothermal GaN substrate was polished and chemical-mechanical polished. The free-standing ammonothermal GaN substrate was then characterized by x-ray diffraction, using a PANalytical X'Pert PRO diffractometer using an electron energy of 45 kV with a 40 mA line focus, a 0.0002 degree step, a 1 sec dwell time, an Ge(220) mirror, a slit height of 1.0 mm and a slit width of 1.0 mm, at nine different locations across the substrate. The results of an analysis of the formed GaN substrate are summarized in FIG. 13. The range of miscut along [1-100] was measured to be 0.078 degrees over the central 80% of the large area surface of the crystal, and the range of miscut along [11-20] was measured to be 0.063 degrees over the central 80% of the large area surface of the crystal. Thus, in some embodiments, a free standing crystal having a miscut angle that varies by 0.1 degree or less in the central 80% of the large area surface of the crystal along a first direction and a miscut angle that varies by 0.1 degree or less in the central 80% of the large area surface of the crystal along a second direction orthogonal to the first direction. By contrast, an identical measurement on a commercial HVPE wafer resulted in a range of miscut along [1-100] of 0.224 degrees and a range of miscut along [11-20] of 0.236 degrees. The full width at half maximum of the rocking-curve for the (002) reflection was measured as 36 arc seconds, while that of the (201) reflection was measured as 32 arc seconds, as summarized in the tables and graphs shown FIG. 14. By contrast, identical measurements on a 50 mm diameter, commercial HVPE substrate produced values of 48 and 53 arc seconds, respectively, and identical measurements on a 100 mm diameter, commercial HVPE substrate produced values of 78 and 93 arc seconds, respectively.

Example 5

Figure 15:
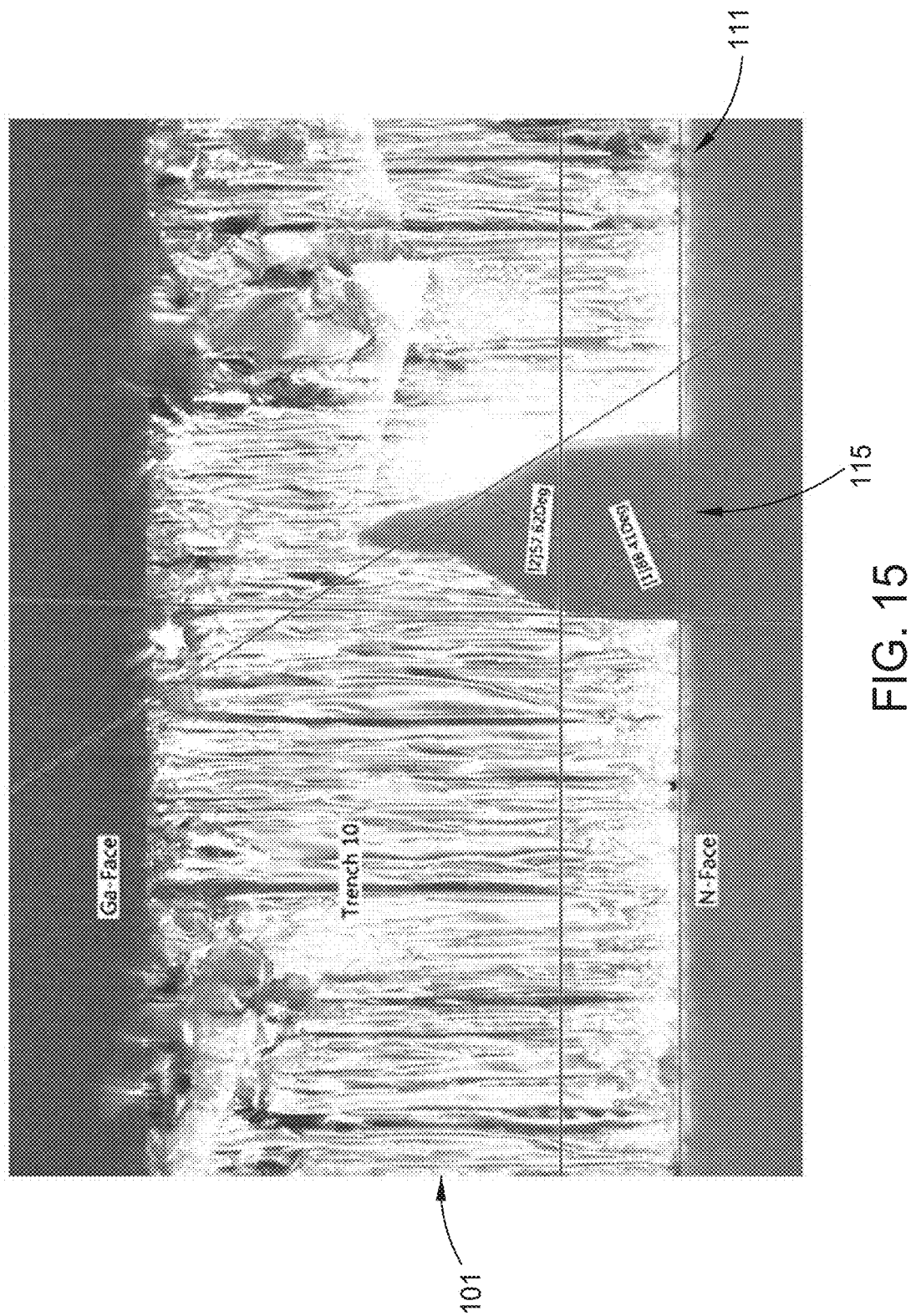
FIG. 15 is an optical micrograph of a laser-cut cross section of a trench in a c-plane GaN substrate that has been prepared according to an embodiment of the present disclosure.

A c-plane oriented bulk GaN crystal grown by HVPE, approximately 0.3 millimeters thick, was provided for use as a substrate for patterning and ammonothermal crystal growth. A 100-nanometer-thick layer of TiW was sputter-deposited as an adhesion layer on the (000-1) N-face of the substrate, followed by a 780-nanometer-thick inert layer comprising Au. A 6-micrometer-thick Au layer was then electroplated on the sputtered layer, increasing the thickness of the inert layer. A pattern was formed on the N-face of the substrate using a frequency-doubled YAG laser with nanosecond pulses. The pattern comprised domains of m-trenches, with linear openings oriented approximately 50-60 micrometers wide and parallel to <10-10>, with a pitch of 1200 micrometers. The patterned substrate was then placed in a stirred beaker with concentrated $H_3PO_4$. The beaker was heated to approximately 280 degrees Celsius over approximately 30 minutes, held at this temperature for approximately 60 minutes, and cooled. A cross section of a trench formed by this procedure, having a depth of approximately 200 micrometers and a width at the top of approximately 80 micrometers, is shown in FIG. 15. The sidewalls of the trench, remarkably, are nearly vertical.

Example 6

Figure 16:
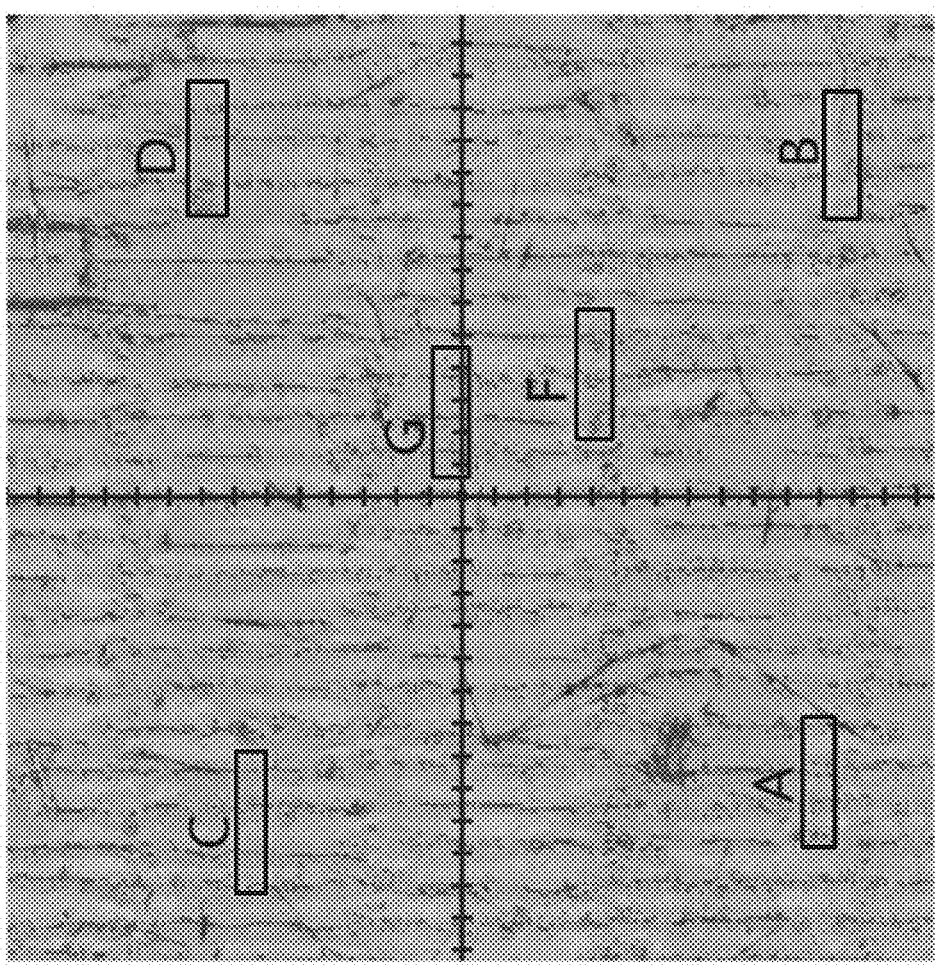
FIG. 16 is a plan-view optical micrograph of a c-plane ammonothermal GaN layer that has been subjected to defect-selective etching, showing a low concentration of etch pits in the window region above slit-shaped mask openings oriented along a <10-10> direction and a linear array of etch pits (threading dislocations) at coalescence fronts formed approximately midway between two window regions, according to an embodiment of the present disclosure.

A patterned, trenched c-plane-oriented bulk GaN substrate was prepared by a similar procedure as that described in Example 5, except that a higher power was used for the laser so that slots were formed that fully penetrated the substrate. After etching with concentrated $H_3PO_4$ at approximately 280 degrees Celsius for approximately 30 minutes, the width of the slots was approximately 115 micrometers. The patterned substrates were placed in a silver capsule along with a 15%-open-area baffle, polycrystalline GaN nutrient, $NH_4F$ mineralizer, and ammonia, and the capsule was sealed. The ratios of GaN nutrient and $NH_4F$ mineralizer to ammonia were approximately 1.74 and 0.099 respectively, by weight. The capsule was placed in an internally-heated high pressure apparatus and heated to temperatures of approximately 667 degrees Celsius for the upper, nutrient zone and approximately 681 degrees Celsius for the lower, crystal growth zone, maintained at these temperatures for approximately 500 hours, and then cooled and removed. Ammonothermal GaN filled in most of the volume in the trenches of the trenched substrate, grew through the linear openings in the patterned mask on the HVPE GaN substrate, grew laterally, and coalesced fully, forming an ammonothermal GaN layer approximately 2010 micrometers thick with a smooth top surface. The surface of the ammonothermal GaN layer was lightly etched and was examined by optical microscopy. An optical micrograph of the layer is shown in FIG. 16. The etch pits in the rectangles A, B, C, D, E, F, and G shown in FIG. 16 were counted, leading to a determination that the average etch pit density, which is believed to accurately represent the threading dislocation density, of the ammonothermal GaN layer grown on the patterned, laser-trenched substrate, was approximately $6.0 \times 10^3$ $cm^{-2}$.

While the foregoing is directed to embodiments of the present disclosure, other and further embodiments of the disclosure may be devised without departing from the basic scope thereof, and the scope thereof is determined by the claims that follow.

What is claimed is:

1. A free-standing crystal, comprising a group III metal and nitrogen, wherein the free-standing crystal comprises:
    a wurtzite crystal structure;
    a first surface having a maximum dimension greater than 40 millimeters in a first direction;
    an average concentration of stacking faults below $10^3$ $cm^{-1}$;
    an average concentration of threading dislocations between $10^1$ $cm^{-2}$ and $10^6$ $cm^{-2}$, wherein the average concentration of threading dislocations on the first surface varies periodically by at least a factor of two in the first direction, a period of the variation in the first direction being between 5 micrometers and 20 millimeters; and
    a miscut angle that varies by 0.1 degree or less along the first direction and by 0.1 degree or less along a second direction orthogonal to the first direction in the central 80% of an area of the first surface of the free-standing crystal,
    wherein
        the first surface comprises a plurality of first regions, each of the plurality of first regions having a locally-approximately-linear array of threading dislocations with a concentration between 5 $cm^{-1}$ and $10^5$ $cm^{-1}$,
        the first surface further comprises a plurality of second regions, each of the plurality of second regions being disposed between an adjacent pair of the plurality of first regions and having a concentration of threading dislocations below $10^5$ $cm^{-2}$ and a concentration of stacking faults below $10^3$ $cm^{-1}$, and
        the first surface further comprises a plurality of third regions, each of the plurality of third regions being disposed within one of the plurality of second regions or between an adjacent pair of second regions and having a minimum dimension between 10 micrometers and 500 micrometers and threading dislocations with a concentration between $10^3$ $cm^{-2}$ and $10^8$ $cm^{-2}$.

2. The free-standing crystal of claim 1, wherein the first surface of the free-standing crystal further comprises an impurity concentration of H greater than $10^{16}$ $cm^{-3}$, and an impurity concentration of at least one of Li, Na, K, F, Cl, Br, and I greater than $10^{15}$ $cm^{-3}$, as quantified by calibrated secondary ion mass spectrometry.

3. The free-standing crystal of claim 2, wherein the first surface is characterized by impurity concentrations of oxygen (O), hydrogen (H), and at least one of fluorine (F) and chlorine (CI) between $1 \times 10^{16}$ $cm^{-3}$ and $1 \times 10^{19}$ $cm^{-3}$, between $1 \times 10^{16}$ $cm^{-3}$ and $2 \times 10^{19}$ $cm^{-3}$, and between $1 \times 10^{15}$ $cm^{-3}$ and $1 \times 10^{19}$ $cm^{-3}$, respectively.

4. The free-standing crystal of claim 2, wherein the first surface is characterized by impurity concentrations of oxygen (O), hydrogen (H), and at least one of sodium (Na) and potassium (K) between $1 \times 10^{16}$ $cm^{-3}$ and $1 \times 10^{19}$ $cm^{-3}$, between $1 \times 10^{16}$ $cm^{-3}$ and $2 \times 10^{19}$ $cm^{-3}$, and between $3 \times 10^{15}$ $cm^{-3}$ and $1 \times 10^{18}$ $cm^{-3}$, respectively.

5. The free-standing crystal of claim 2, wherein a ratio of the impurity concentration of H to an impurity concentration of O is between about 0.3 and about 100.

6. The free-standing crystal of claim 5, wherein the ratio of the impurity concentration of H to the impurity concentration of O is between about 0.4 and about 10.

7. The free-standing crystal of claim 1, wherein the first surface is characterized by a symmetric x-ray rocking curve full width at half maximum less than 50 arcsec, as measured by an x-ray diffractometer with a slit height of 1 millimeter.

8. The free-standing crystal of claim 1, wherein a pitch dimension between adjacent pairs of first regions is between 400 micrometers and 5 millimeters.

9. The free-standing crystal of claim 1, wherein the first surface is characterized by a crystallographic orientation within 5 degrees of the {10-10} m-plane.

10. The free-standing crystal of claim 1, wherein the first surface is characterized by a crystallographic orientation within 5 degrees of the (0001)+c-plane or within 5 degrees of the (000-1)–c-plane.

11. The free-standing crystal of claim 1, wherein the first surface is characterized by a crystallographic orientation within 5 degrees of a semipolar orientation selected from {6 0 –6 ±1}, {5 0 –5 ±1}, {4 0 –4 ±1}, {3 0 –3 ±1}, {5 0 –5 ±2}, {7 0 –7 ±3}, {2 0 –2 ±1}, {3 0 –3 ±2}, {4 0 –4 ±3}, {5 0 –5 ±4}, {1 0 –1 ±1}, {1 0 –1 ±2}, {1 0 –1 ±3}, {2 1 –3 ±1}, and {3 0 –3 ±4}.

12. The free-standing crystal of claim 1, wherein the locally-approximately-linear arrays of the plurality of first regions are oriented within 5 degrees of a crystallographic plane selected from {1 0 –1 0}, {1 1 –2 0}, and (0 0 0 ±1), and a projection of the crystallographic plane on the first surface.

13. The free-standing crystal of claim 1, further comprising a second surface, wherein the second surface is substantially parallel to the first surface; and the free-standing crystal is characterized by a thickness between the first surface and the second surface between about 0.1 millimeter and about 1 millimeter, by a total thickness variation of less than about 10 micrometers, and by a macroscopic bow less than about 50 micrometers.

14. The free-standing crystal of claim 1, wherein the first surface has a maximum dimension greater than 50 millimeters in the first direction.

15. The free-standing crystal of claim 14, wherein the first surface has a maximum dimension greater than 75 millimeters in the first direction.

16. The free-standing crystal of claim 1, wherein the period of the variation in the first direction is between 200 micrometers and 5 millimeters.

17. The free-standing crystal of claim 1, wherein the plurality of third regions are characterized by threading dislocations with a concentration between $10^3$ cm$^{-2}$ and $10^6$ cm$^{-2}$.

18. The free-standing crystal of claim 17, wherein the plurality of third regions are characterized by threading dislocations with a concentration between $10^3$ cm$^{-2}$ and $10^5$ cm$^{-2}$.

19. The free-standing crystal of claim 1, wherein a ratio between the concentration of threading dislocations within the third regions divided by the concentration of threading dislocations within the second regions is between 2 and $10^4$.

20. The free-standing crystal of claim 19, wherein the ratio between the concentration of threading dislocations within the third regions divided by the concentration of threading dislocations within the second regions is between 2 and 3000.

21. The free-standing crystal of claim 20, wherein the ratio between the concentration of threading dislocations within the third regions divided by the concentration of threading dislocations within the second regions is between 3 and 1000.

22. The free-standing crystal of claim 1, wherein the first surface has a concentration of macro defects, each macro defect being characterized by a diameter or characteristic dimension greater than about 100 micrometers, of less than about 1 cm$^{-2}$.

23. The free-standing crystal of claim 1, characterized by an optical absorption coefficient at a wavelength of 400 nanometers that is less than about 10 cm$^{-1}$.

24. A free-standing crystal, comprising a group III metal and nitrogen, wherein the free-standing crystal comprises:
a wurtzite crystal structure;
a first surface having a maximum dimension greater than 40 millimeters in a first direction;
an average concentration of stacking faults below $10^3$ cm$^{-1}$;
an impurity concentration, at the first surface, of H greater than $10^{17}$ cm$^{-3}$ and an impurity concentration of at least one of Li, Na, K, F, Cl, Br, and I greater than $10^{15}$ cm$^{-3}$, as quantified by calibrated secondary ion mass spectrometry;
an average concentration of threading dislocations between $10^1$ cm$^{-2}$ and $10^6$ cm$^{-2}$, wherein the average concentration of threading dislocations on the first surface varies periodically by at least a factor of two in the first direction, a period of the variation in the first direction being between 5 micrometers and 20 millimeters; and
a miscut angle that varies by 0.2 degree or less along the first direction and by 0.2 degree or less in the central 80% of an area of the first surface of the free-standing crystal,
wherein
the first surface comprises a plurality of first regions, each of the plurality of first regions having a locally-approximately-linear array of threading dislocations with a concentration between 5 cm$^{-1}$ and $10^5$ cm$^{-1}$,
the first surface further comprises a plurality of second regions, each of the plurality of second regions being disposed between an adjacent pair of the plurality of first regions and having a concentration of threading dislocations below $10^5$ cm$^{-2}$ and a concentration of stacking faults below $10^3$ cm$^{-1}$, and
the first surface further comprises a plurality of third regions, each of the plurality of third regions being disposed within one of the plurality of second regions or between an adjacent pair of second regions and having a minimum dimension between 10 micrometers and 500 micrometers and threading dislocations with a concentration between $10^3$ cm$^{-2}$ and $10^8$ cm$^{-2}$.

* * * * *